United States Patent
Kim et al.

(10) Patent No.: US 11,217,748 B2
(45) Date of Patent: Jan. 4, 2022

(54) SEMICONDUCTOR DEVICE INCLUDING A DATA STORAGE MATERIAL PATTERN

(71) Applicant: SAMSUNG ELECTRONICS CO., LTD., Suwon-si (KR)

(72) Inventors: Youngtak Kim, Hwaseong-si (KR); Sangjine Park, Suwon-si (KR); Wonjun Lee, Seoul (KR); Hyeyeong Seo, Hwaseong-si (KR); Jaeuk Shin, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 16 days.

(21) Appl. No.: 16/807,245

(22) Filed: Mar. 3, 2020

(65) Prior Publication Data
US 2021/0028360 A1 Jan. 28, 2021

(30) Foreign Application Priority Data
Jul. 23, 2019 (KR) .......................... 10-2019-0088807

(51) Int. Cl.
*H01L 45/00* (2006.01)

(52) U.S. Cl.
CPC .......... *H01L 45/1608* (2013.01); *H01L 45/06* (2013.01); *H01L 45/1253* (2013.01); *H01L 45/144* (2013.01); *H01L 45/1666* (2013.01)

(58) Field of Classification Search
CPC ..................... H01L 45/1608; H01L 45/1675
See application file for complete search history.

(56) References Cited

U.S. PATENT DOCUMENTS

| 8,394,667 | B2 | 3/2013 | Liu et al. |
| 8,686,387 | B2 | 4/2014 | Nishimura |
| 8,729,667 | B2 | 5/2014 | Kuniya |
| 9,484,196 | B2 | 11/2016 | Song et al. |
| 2015/0287916 | A1 | 10/2015 | Campbell et al. |
| 2017/0271581 | A1* | 9/2017 | Seong ................. H01L 27/2427 |
| 2017/0364306 | A1 | 12/2017 | Kim |
| 2018/0158869 | A1* | 6/2018 | Chuang ................... H01L 43/08 |

FOREIGN PATENT DOCUMENTS

| JP | 2010-225872 | 10/2010 |
| JP | 2011-071302 | 4/2011 |

* cited by examiner

*Primary Examiner* — Mounir S Amer
(74) *Attorney, Agent, or Firm* — F. Chau & Associates, LLC

(57) ABSTRACT

A semiconductor device, includes: a first conductive structure on a substrate; a second conductive structure on the first conductive structure; and a first memory cell structure between the first conductive structure and the second conductive structure, wherein the first memory cell structure includes: a switching material pattern on the first conductive structure; a data storage material pattern on the switching material pattern; and an upper conductive pattern on the data storage material pattern, wherein a first width of a lower region of the data storage material pattern is less than a first width of the switching material pattern, and wherein a first width of the upper conductive pattern is less than a width of an upper region of the data storage material pattern.

19 Claims, 38 Drawing Sheets

SEMICONDUCTOR DEVICE INCLUDING A DATA STORAGE MATERIAL PATTERN

CROSS-REFERENCE TO RELATED APPLICATION(S)

This application claims priority under 35 U.S.C. § 119 to Korean Patent Application No, 10-2019-0088807 filed on Jul. 23, 2019 in the Korean Intellectual Property Office, the disclosure of which is incorporated by reference herein in its entirety.

TECHNICAL FIELD

Exemplary embodiments of the present inventive concept relate to a semiconductor device which may increase integration density.

DISCUSSION OF THE RELATED ART

Next generation semiconductor devices such as a phase-change random-access memory (PRAM), and the like, are under development in an effort to produce a semiconductor device, such as a memory device, with high performance and low power consumption. Such semiconductor devices may have a resistance value that changes in accordance with a current or a voltage, and may be manufactured using a data storage material which may maintain a constant resistance value when a current or a voltage stops being supplied.

SUMMARY

According to an exemplary embodiment of the present inventive concept, a semiconductor device, includes: a first conductive structure on a substrate, a second conductive structure on the first conductive structure, a first memory cell structure between the first conductive structure and the second conductive structure, wherein the first memory cell structure includes: a switching material pattern on the first conductive structure, a data storage material pattern on the switching material pattern; and an upper conductive pattern on the data storage material pattern, wherein a maximum width of a lower region of the data storage material pattern is less than a minimum width of the switching material pattern, and wherein a maximum width of the upper conductive pattern is less than a width of an upper region of the data storage material pattern.

According to an exemplary embodiment of the present inventive concept, a semiconductor device, includes: first conductive lines extending in a first direction on a substrate; second conductive lines extending on the first conductive lines in a second direction substantially perpendicular to the first direction; and memory cell regions between the first conductive lines and the second conductive lines, wherein the memory cell regions include a first memory cell region, and a second memory cell region adjacent to the first memory cell region, wherein the first memory cell region includes: a first data storage material pattern; a first upper electrode pattern on the first data storage material pattern; and a first upper conductive pattern on the first upper electrode pattern, wherein the second memory cell region includes: a second data storage material pattern; a second upper electrode pattern on the second data storage material pattern; and a second upper conductive pattern on the second upper electrode pattern, and wherein a first distance between an upper region of the first data storage material pattern and an upper region of the second data storage material pattern is less than a second distance between the first upper conductive pattern and the second upper conductive pattern.

According to an exemplary embodiment of the present inventive concept, a semiconductor device, includes: a first conductive structure on a semiconductor substrate; a second conductive structure on the first conductive structure; a first memory cell structure between the first conductive structure and the second conductive structure; a third conductive structure on the second conductive structure; and a second memory cell structure between the second conductive structure and the third conductive structure, wherein each of the first and second memory cell structures includes: a switching structure; a data storage structure on the switching structure; and an upper conductive pattern on the data storage structure, wherein the switching structure includes: a lower conductive pattern on the substrate; a switching material pattern on the lower conductive pattern; and an intermediate conductive pattern on the switching material pattern, wherein the data storage structure includes: a lower electrode pattern on the intermediate conductive pattern; a data storage material pattern on the lower electrode pattern; and an upper electrode pattern on the data storage material pattern, wherein a largest width of a lower region of the data storage material pattern is less than a smallest width of the switching material pattern, and wherein a largest width of the upper electrode pattern and a largest width of the upper conductive pattern is less than a width of an upper region of the data storage material pattern.

BRIEF DESCRIPTION OF DRAWINGS

The above and other features of the present inventive concept will be more apparent by describing in detail exemplary embodiments thereof, with reference to the accompanying drawings, in which.

DETAILED DESCRIPTION OF THE EMBODIMENTS

Hereinafter, exemplary embodiments of the present inventive concept will be described with reference to the accompanying drawings.

Figure 1:
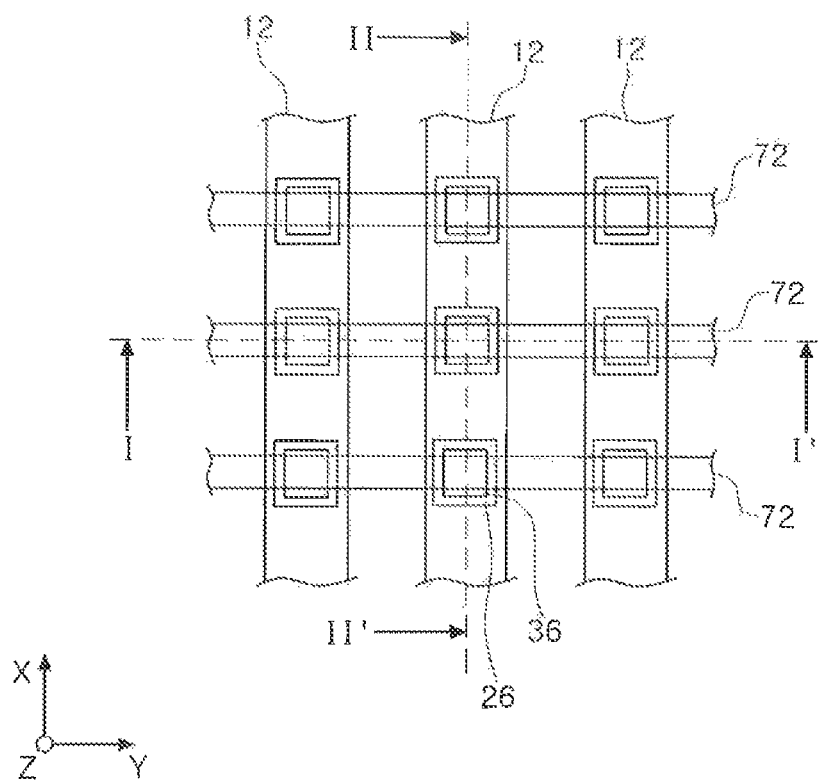
FIG. 1 is a plan diagram illustrating a semiconductor device according to an exemplary embodiment of the present inventive concept.

A semiconductor device according to an exemplary embodiment of the present inventive concept will be described with reference to FIGS. 1 to 2C. FIG. 1 is a plan diagram illustrating a semiconductor device according to an exemplary embodiment of the present inventive concept.

Referring to FIG. 1, a first conductive structure 12 and a second conductive structure 72 on the first conductive structure 12 may be disposed. In a region in which the first conductive structure 12 and the second conductive structure 72 intersect with each other, memory cell structures MC1 and MC2 may be disposed between the first conductive structure 12 and the second conductive structure 72. The memory cell structures MC1 and MC2 may include various patterns such as a quadrangular shape (e.g., a square shape, a rectangular shape, and the like), or a circular shape, and the like.

In an exemplary embodiment of the present inventive concept, the memory cell structures MC1 and MC2 may include a switching material pattern 26 and a data storage material pattern 36. For example, each of the switching material pattern 26 and the data storage material pattern 36 may have a square shape. The data storage material pattern 36 may be disposed on a central portion of an upper surface of the switching material pattern 26.

Figure 2A:
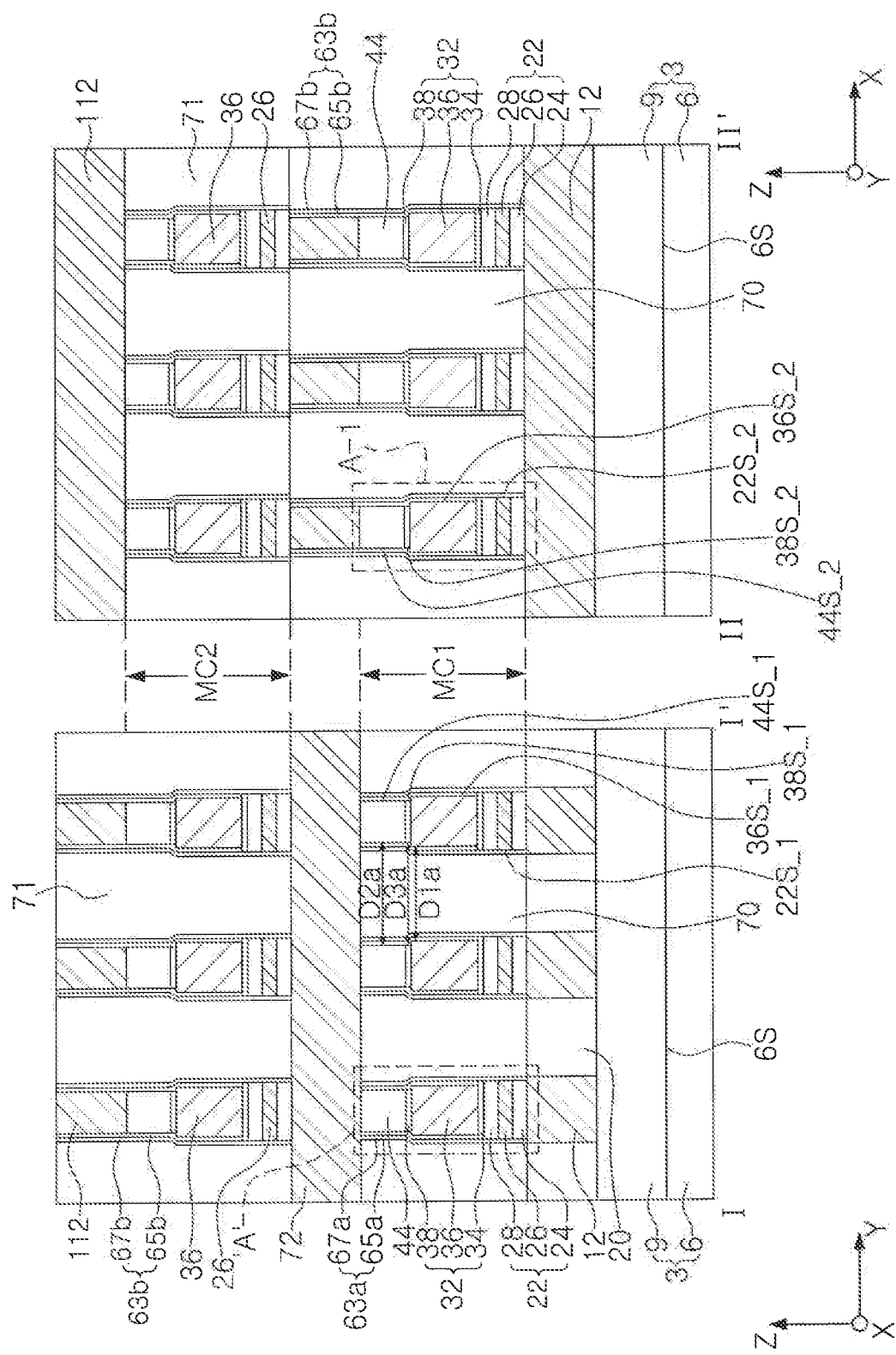
FIG. 2A is a cross-sectional diagram illustrating a semiconductor device according to an exemplary embodiment of the present inventive concept.
Figure 2B:
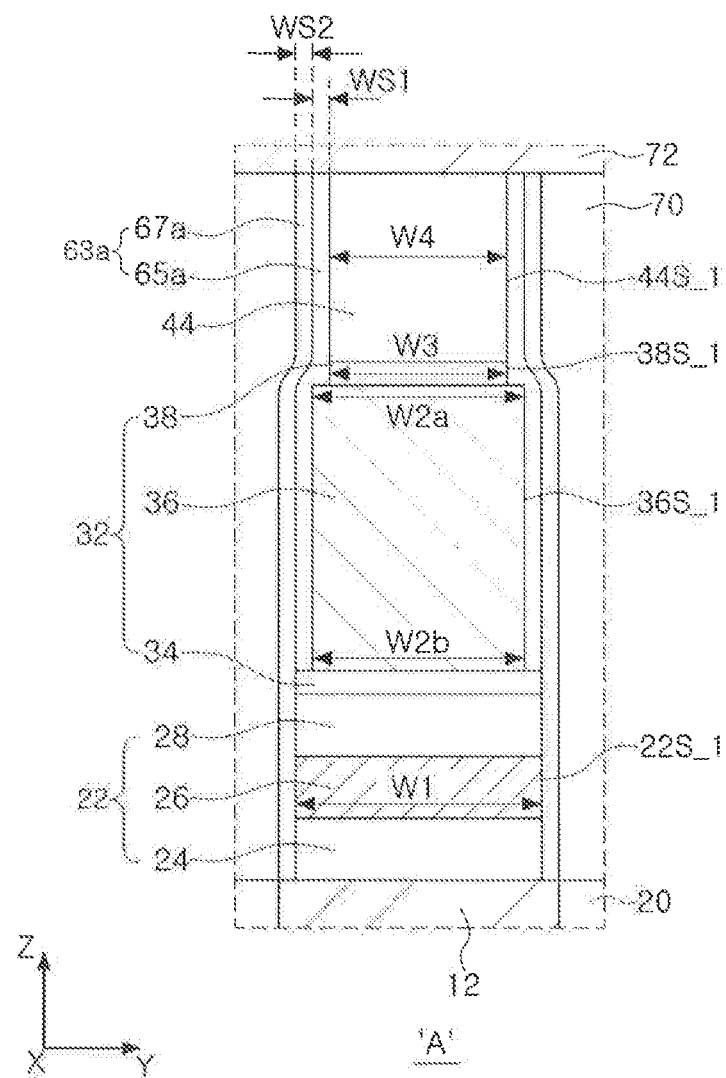
FIGS. 2B, 2C, 2D and 2E are enlarged cross-sectional diagrams illustrating a portion of a semiconductor device according to an exemplary embodiment of the present inventive concept.
Figure 2C:
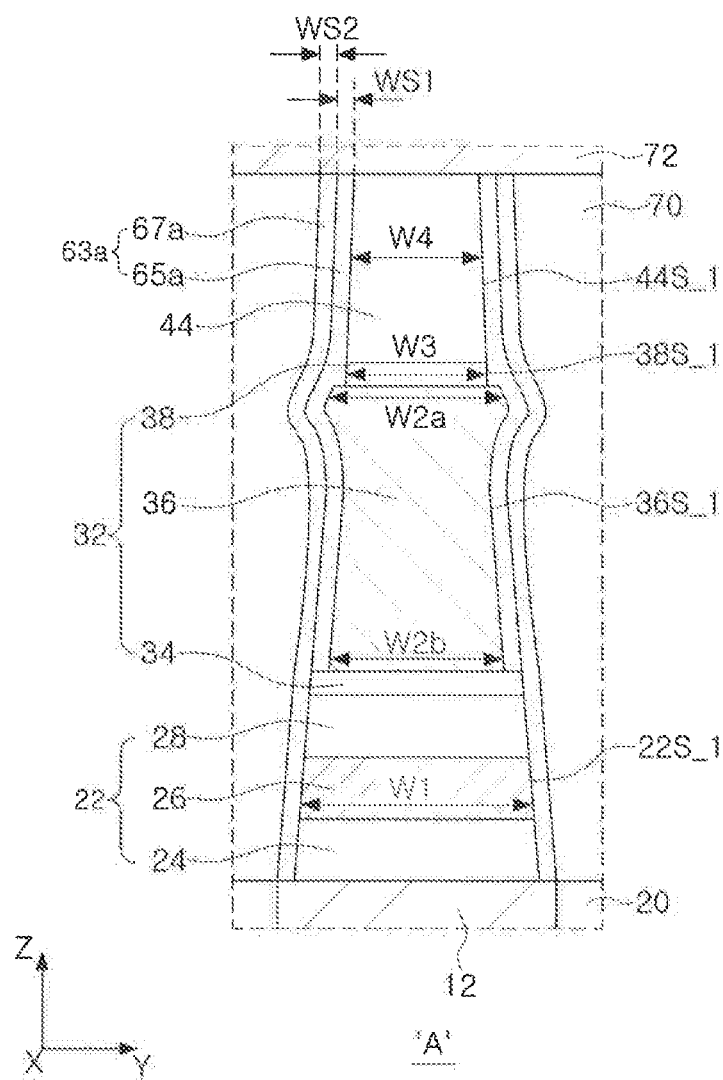

FIG. 2A is a cross-sectional diagram illustrating cross-sectional surfaces of the semiconductor device taken along lines I-I' and II-II' in FIG. 1 according to an exemplary embodiment of the present inventive concept, and FIGS. 2B and 2C are enlarged diagrams illustrating region 'A' illustrated in FIG. 2A according to an exemplary embodiment of the present inventive concept.

Referring to FIGS. 1 and 2A, a base structure 3 may be provided. The base structure 3 may include a semiconductor substrate 6 and a circuit region 9 on the semiconductor substrate 6. The semiconductor substrate 6 may be, for example, a substrate formed of a semiconductor material such as silicon. The circuit region 9 may be a region in which a circuit required for driving memory cells is disposed.

In an exemplary embodiment of the present inventive concept, a plurality of the first conductive structures 12 may be disposed in parallel to each other on the base structure 3. Each of the first conductive structures 12 may have a linear shape extending in a first direction X, and the first conductive structures 12 may be spaced apart from each other in a second direction Y and may be disposed side by side. Each of the second conductive structures 72 may have a linear shape extending in the second direction Y, and the second conductive structures 72 may be spaced apart from each other in the first direction X and may be disposed in parallel to each other. Each of the third conductive structures 112 may have a linear shape extending in the first direction X, and the third conductive structures 112 may be spaced apart from each other in the second direction Y and may be disposed side by side. The first direction X and the second direction Y may be substantially perpendicular to each other, and may be in parallel to an upper surface 6s of the semiconductor substrate 6.

In an exemplary embodiment of the present inventive concept, one of the first conductive structure 12 and the second conductive structure 72 may be a word line, and the other may be a bit line. When the second conductive structure 72 is a bit line, the third conductive structure 112 may be a word line.

In an exemplary embodiment of the present inventive concept, the first conductive structures 12, the second conductive structures 72, and the third conductive structures 112 may be referred to as first conducive lines, second conductive lines, and third conductive lines, respectively.

A gap-fill insulating pattern 20 may be disposed on each of lateral surfaces of the first conductive structure 12. The gap-fill insulating pattern 20 may be disposed between the first conductive structures 12, and may have a linear shape extending in the first direction X. The gap-fill insulating pattern 20 may be include an insulating material such as silicon oxide, and the like.

The memory cell structures MC1 and MC2 may be disposed between the first conductive structure 12 and the second conductive structure 72 and between the second conductive structure 72 and the third conductive structure 112.

In an exemplary embodiment of the present inventive concept, the memory cell structures MC1 and MC2 may include a first memory cell structure MC1 disposed between the first conductive structure 12 and the second conductive structure 72, and a second memory cell structure MC2 disposed between the second conductive structure 72 and the third conductive structure 112. The memory cell structures MC1 and MC2 may have a stacked structure in a third direction Z. For example, the memory structures MC1 and MC2 may form a two-stack structure. The third direction Z may be substantially perpendicular to the first and second directions X and Y, and may be substantially perpendicular to the upper surface 6s of the substrate 6. In the description below, a basic unit of the memory cell structures MC1 and MC2 will be described, and a two-stack structure of the memory cell structures MC1 and MC2 will be described.

Referring to FIGS. 2A to 2C, the first memory cell structure MC1 may include a switching structure 22 on the first conductive structure 12, a data storage structure 32 on the switching structure 22, and an upper conductive pattern 44 on the data storage structure 32. The second memory cell structure MC2 may include a switching structure 22 on the second conductive structure 72, a data storage structure 32 on the switching structure 22, and an upper conductive pattern 44 on the data storage structure 32.

The switching structure 22 may include a lower conductive pattern 24 on the first conductive structure 12. In addition, the switching structure 22 may include the switching material pattern 26 on the lower conductive pattern 24, and an intermediate conductive pattern 28 on the switching material pattern 26. The lower conductive pattern 24 may be disposed between the first conductive structure 12 and the switching material pattern 26. The switching material pattern 26 may be disposed between the lower conductive pattern 24 and the intermediate conductive pattern 28. The intermediate conductive pattern 28 may be disposed between the switching material pattern 26 and the data storage structure 32.

The data storage structure 32 may include a lower electrode pattern 34 on the intermediate conductive pattern 28. Further the data storage structure 32 may include the data storage material pattern 36 on the lower electrode pattern 34, and an upper electrode pattern 38 on the data storage material pattern 36. The lower electrode pattern 34 may be disposed between the intermediate conductive pattern 28 and the data storage material pattern 36. The data storage material pattern 36 may be disposed between the lower electrode pattern 34 and the upper electrode pattern 38. The upper electrode pattern 38 may be disposed between the data storage material pattern 36 and the upper conductive pattern 44.

In an exemplary embodiment of the present inventive concept, the data storage material pattern 36 may be disposed on a central portion of an upper surface of the lower electrode pattern 34. For example, the lower electrode pattern 34 may have a width in the second direction Y that is greater than that of the data storage material pattern 36.

In an exemplary embodiment of the present inventive concept, the upper electrode pattern 36 may be disposed on a central portion of an upper surface of the data storage material pattern 36.

A first insulating pattern 70 and a second insulating pattern 72 may be disposed. For example, the first insulating pattern 70 may be disposed on a lateral surface of each of the first memory cell structures MC1 and fill a region between the first conductive structure 12 and the second conductive structure 72, and a second insulating pattern 71 may be disposed on a lateral surface of each of the second memory cell structures MC2 and fill a region between the second conductive structure 72 and the third conductive structure 112. The first insulating pattern 70 may surround lateral surfaces of the first memory cell structures MC1. The second insulating pattern 71 may surround lateral surfaces of the second memory cell structures MC2. The first and second insulating patterns 70 and 71 may be formed of an insulating material such as silicon oxide, silicon nitride, or the like.

In an exemplary embodiment of the present inventive concept, the switching structure 22 may form an ovonic threshold switching device. In an exemplary embodiment of the present inventive concept, the switching material pattern 26 may be formed of a chalcogenide-based ovonic threshold switching material which may maintain an amorphous phase when the semiconductor device operates. For example, the switching material pattern 26 may include an alloy material including at least two or more elements from among As, S, Se, Te, and/or Ge, or may include an additional element (e.g., elements Si, N, or the like) which may maintain an amorphous phase at a relatively higher temperature in addition to the above-mentioned alloy material. The switching material pattern 26 may be formed of at least one of an alloy material including Te, As, Ge, and Si, an alloy material including Ge, Te, and Pb, an alloy material including Ge, Se, and Te, an alloy material including Al, As, and Te, an alloy material including Se, As, Ge, and Si, an alloy material including Se, As, Ge, and C, an alloy material including Se, Te, Ge, and Si, an alloy material including Ge, Sb, Te, and Sc, an alloy material including Ge, Bi, Te, and Se, an alloy material including Ge, As, Sb, and Se, an alloy material including Ge, As, Bi, and Te, and/or an alloy material including Ge, As, Bi, and Se.

For example, the lower conductive pattern 24, the intermediate conductive pattern 28, and the upper conductive pattern 44 may include a carbon layer or a material layer including carbon. In an exemplary embodiment of the present inventive concept, the material layer including carbon may include a metal element such as tungsten (W) and carbon (C). In an exemplary embodiment of the present inventive concept, the material layer including carbon may include other metal elements such as titanium (Ti), tantalum (Ta), ruthenium (Ru), or the like, in addition to tungsten (W). In an exemplary embodiment of the present inventive concept, the material layer including carbon may further include elements such as nitride (N), boron (B), or the like, in addition to carbon (C) and metal elements.

In an exemplary embodiment of the present inventive concept, the data storage material pattern 36 may include of a chalcogenide-based phase change memory material, a phase of which may change from an amorphous phase having high resistivity to a crystalline phase having low resistivity or from a crystalline phase to an amorphous phase in accordance with a temperature and a time of heating the data storage material pattern 36 by an applied current. For example, the data storage material pattern 36 may be configured as a phase change memory material such as a chalcogenide material including Ge, Sb, and/or Te, and the like. In addition, the data storage material pattern 36 may be a phase change memory material including at least one of Te or Se and at least one of Ge, Sb, Bi, Pb, Sn, As, S, Si, P, O, N, or In. In an exemplary embodiment of the present inventive concept, the data storage material pattern 36 may be formed of a data storage material which may store data in a different manner, instead of a phase change memory material.

The lower electrode pattern 34 and the upper electrode pattern 38 may be formed of a conductive material such as tungsten, or the like. The lower electrode pattern 34 and the upper electrode pattern 38 may be formed of a conductive material including W, TiN, TiAlN, TaN, WN, MoN, TiSiN, TiCN, TiBN, ZrSiN, WSiN, WBN, ZrAlN, MoAlN, TaSiN, TaAlN, TiON, TiAlON, WON, and TaON, or combinations thereof.

In an exemplary embodiment of the present inventive concept, the memory cell structures MC1 and MC2 may be referred to as memory cell regions, and the memory cell regions may include a first memory cell region and a second memory cell region adjacent to each other. The memory cell regions may be provided to describe a distance relationship between the first memory cell region and the second memory cell region adjacent to each other, and may be the same as the memory cell structures MC1 and MC2.

The first memory cell region (e.g., a first memory cell structure MC1) may include a first switching material pattern, a first data storage material pattern on the first switching material pattern, a first upper electrode pattern on the first data storage material pattern, and a first upper conductive pattern on the first upper electrode pattern.

The second memory cell region (e.g., another first memory cell structure) may include a second switching material pattern, a second data storage material pattern on the second switching material pattern, a second upper electrode pattern on the second data storage material pattern, and a second upper conductive pattern on the second upper electrode pattern.

In an exemplary embodiment of the present inventive concept, a lateral surface of an upper region of the first data storage material pattern and a lateral surface of an upper region of the second data storage material pattern that opposes the lateral surface of an upper region of the first data storage material pattern may be spaced apart from each other by a first distance D1*a*.

In an exemplary embodiment of the present inventive concept, a lateral surface of the first upper conductive pattern and a lateral surface of the second upper conductive pattern that opposes the lateral surface of the first upper conductive pattern may be spaced apart from each other by a second distance D2a.

In an exemplary embodiment of the present inventive concept, a lateral surface of the first upper electrode pattern and a lateral surface of the second upper electrode pattern that opposes the lateral surface of the first upper electrode pattern may be spaced apart from each other by a third distance D3a.

In an exemplary embodiment of the present inventive concept, the first distance D1a may be less than a minimum value of the second distance D2a, and a maximum value of the third distance D3a may be substantially the same as a minimum value of the second distance D2a.

The descriptions off the first to third distances D1a, D2a, and D3a may be applied in both the first and second directions X and Y.

However, the present inventive concept is not limited thereto. For example, the first to third distances D1a, D2a, and D3a may change in accordance with a modified exemplary embodiment of the present inventive concept.

In the embodiment illustrated in FIG. 2C, each of the lower conductive pattern 24, the switching material pattern 26, the intermediate conductive pattern 28, the lower electrode pattern 34, the data storage material pattern 36, the upper electrode pattern 38, and the upper conductive pattern 44 may have a sloped lateral surface, and a width of an upper portion of the first memory cell structure MC1 is less than a width of a lower portion of the first memory cell structure MC1. However, the present inventive concept is not limited thereto.

In the present embodiment illustrated in FIG. 2C, the data storage material pattern 36 may include an upper region adjacent to an interfacial surface between the data storage material pattern 36 and the upper electrode pattern 38. For example, the interfacial surface may be where the upper surface of the data storage material 36 contacts the lower surface of the upper electrode pattern 38. In addition, the data storage material 36 may include a lower region adjacent to an interfacial surface between the data storage material pattern 36 and the lower electrode pattern 34, and an intermediate region between the upper region and the lower region. For example, the interfacial surface may be where the lower surface of the data storage material 36 contacts the upper surface of the lower electrode pattern 38. The data storage material pattern 36 may have a shape in which a width of the upper region and a width of the lower region may be greater than a width of the intermediate region. For example, the data storage material pattern 36 may have lateral surfaces that are partially recessed such that the intermediate region may have an inwardly recessed shape. For example, the data storage material pattern 36 may have a concave shape. However, the present inventive concept is not limited thereto.

Referring to FIGS. 2B and 2C, lateral surfaces of each of the switching material pattern 26, the lower conductive pattern 24, the intermediate conductive pattern 28, and the lower electrode pattern 34 may be substantially coplanar with one another.

In an exemplary embodiment of the present inventive concept, a width of the switching material pattern 26 may be referred to as a first width W1.

In an exemplary embodiment of the present inventive concept, the data storage material pattern 36 may have a width W2a of in the upper region, and may have a width W2b of in the lower region. A maximum value of the width W2b of the lower region may be less than a minimum value of the first width W1. For example, the maximum value of the width W2b may be adjacent the lower surface of the data storage material 36, and the minimum value of the first width W1 may be adjacent an upper surface of the switching material pattern 26.

In an exemplary embodiment of the present inventive concept, the upper electrode pattern 38 may have a third width W3, and a maximum value of the third width W3 may be less than the width W2b of the lower region of the data storage material 36. For example, the maximum value of the third width W3 may be adjacent a lower surface of the upper electrode pattern 38.

In an exemplary embodiment of the present inventive concept, the upper conductive pattern 44 may have a fourth width W4, and a maximum value of the fourth width W4 may be less than the width W2b of the lower region and may be substantially the same as a minimum value of the third width W3. For example, the maximum value of the fourth width W4 may be adjacent a lower surface of the upper conductive pattern 44.

The descriptions of the first to fourth widths W1 to W4 may be applied in both the first and second directions X and Y.

By adjusting the first to fourth widths W1 to W4, a leaning defect of the memory cell structures may be prevented such that durability and reliability of the semiconductor device may increases. Layers disposed on an upper portion of the data storage material pattern 36 may be etched, and a protective spacer may be disposed on lateral surfaces of the etched layers. By adjusting a width of the protective spacer, the widths W2a and W2b of the upper region and the lower region of the data storage material pattern 36 may be adjusted. By forming the protective spacer, a residue of the conductive material including tungsten (W) and a residue of the data storage material may be deposited on the protective spacer, and when a cleaning process is performed, a residue of the data storage material may be effectively removed along with the protective spacer. Accordingly, damage to the memory cell structures MC1 and MC2 caused during an etching process and a cleaning process may be prevented.

In an exemplary embodiment of the present inventive concept, first spacer structures may be disposed between the first memory cell structure MC1 and the first insulating pattern 70 in the second direction Y. Second spacer structures may be disposed between the first memory cell structures MC1 and the first insulating pattern 70 in the first direction X. The first and second spacer structures may be formed of an insulating material such as silicon oxide, silicon nitride, or the like.

As illustrated in FIGS. 2A and 2B, the first spacer structures 63a may include a first spacer 65a adjacent to the memory cell structures MC1 and MC2 and a second spacer 67a adjacent to the first insulating pattern 70.

In an exemplary embodiment of the present inventive concept, the first spacer 65a may extend in the third direction Z from the lower electrode pattern 34, and may be disposed on a first lateral surface 36S_1 of the data storage material pattern 36, a first lateral surface 38S_11 of the upper electrode pattern 38, and a first lateral surface 44S_11 of the upper conductive pattern 44. The first spacer 65a may have a substantially uniform thickness and may have a first spacer width WS1.

In an exemplary embodiment of the present inventive concept, the first lateral surface 38S_1 of the upper electrode pattern 38 and the first lateral surface 44S_1 of the upper conductive pattern 44 may be substantially coplanar with each other.

In an exemplary embodiment of the present inventive concept, the first spacer 65a may cover an edge of an upper surface of the storage material pattern 36. The first spacer 65a may have a curved shape to surround an end of an upper surface of the data storage material pattern 36.

As illustrated in FIG. 2B, a sum of widths of edges of both side of the upper surface of the storage material pattern 36, covered by the first spacer 65a, may be substantially the same as a difference between the width W2a of the upper region and the third width W3.

In an exemplary embodiment of the present inventive concept, the second spacer 67a may extend in the third direction Z from the first conductive structure 12, and may be disposed on an external lateral surface of the first spacer 65a and a first lateral surface 22S_1 of the switching structure 22. The second spacer 67a may have a substantially uniform thickness and may have a second spacer width WS2.

The second spacer 67a may have a curved shape to surround an end of an upper surface of the data storage material pattern 36.

The second spacer 67a may cover an edge of an upper surface of the first conductive structure 12.

As illustrated in FIG. 2B, a sum of width of edges of both sides of the upper surface of the first conductive structure 12, covered by the second spacer 67a, may be substantially the same as a difference between a width of the first conductive line 12 and the first width W1. A difference between a width of the first conductive line 12 and the first width W1 may be substantially the same as twice the second spacer width WS2.

In an exemplary embodiment of the present inventive concept, second spacer structures 63b may include a third spacer 65b and a fourth spacer 67b. For example, the third spacer 65b may be on the memory cell structures MC1 and MC2, and the fourth spacer 67b may be adjacent to the second insulating pattern 71.

In an exemplary embodiment of the present inventive concept, the third spacer 65b may extend from the lower electrode pattern 34 in the third direction Z, and may be disposed on a second lateral surface 36S_2 of the data storage material pattern 36, a second lateral surface 38S_2 of the upper electrode pattern 38, and a second lateral surface 44S_2 of the upper conductive pattern 44. The third spacer 65b may have a substantially uniform thickness and may have a first spacer width WS1.

In an exemplary embodiment of the present inventive concept, the second lateral surface 38S_2 of the upper electrode pattern 38 and the second lateral surface 44S_2 of the upper conductive pattern 44 may be substantially coplanar with each other.

In an exemplary embodiment of the present inventive concept, the third spacer 65b may cover an edge of an upper surface of the data storage material pattern 36. The third spacer 65b may have a curved shape to surround an end of the upper surface of the data storage material pattern 36.

The third spacer 65b may cover an edge of an upper surface of the lower electrode pattern 34.

The fourth spacer 67b may extend from the first conductive structure 12 in the third direction Z, and may be disposed on an external lateral surface of the third spacer 65b and a second lateral surface 22S_12 of the switching structure 22. The fourth spacer 67b may have a substantially uniform thickness and may have a second spacer width WS2.

The fourth spacer 67b may have a curved shape to surround an end of an upper surface of the data storage material pattern 36.

The fourth spacer 67b may cover an edge of an upper surface of the first conductive structure 12.

In an exemplary embodiment of the present inventive concept, the second spacer structures 63b may include a portion extending further than the first spacer structures 63a. Accordingly, a height of each of the second spacer structures 63b in the third direction Z may be greater than a height of each of the first spacer structures 63a in the third direction Z. Accordingly, the third spacer 65b may extend further than the first spacer 65a in the third direction Z and may be in contact with a lateral surface of the second conductive structure 72, and the fourth spacer 67b may extend further than the second spacer 67a and may be disposed on a lateral surface of the second conductive structure 72.

In an exemplary embodiment of the present inventive concept, the first spacer width WS1 and the second spacer width WS2 may not be limited to the examples illustrated in the diagram, and may be different.

In an exemplary embodiment of the present inventive concept, the first spacer 65a and the third spacer 65b may be referred to as a first region, and the second spacer 67a and the fourth spacer 67b may be referred to as a second region.

Figure 2D:
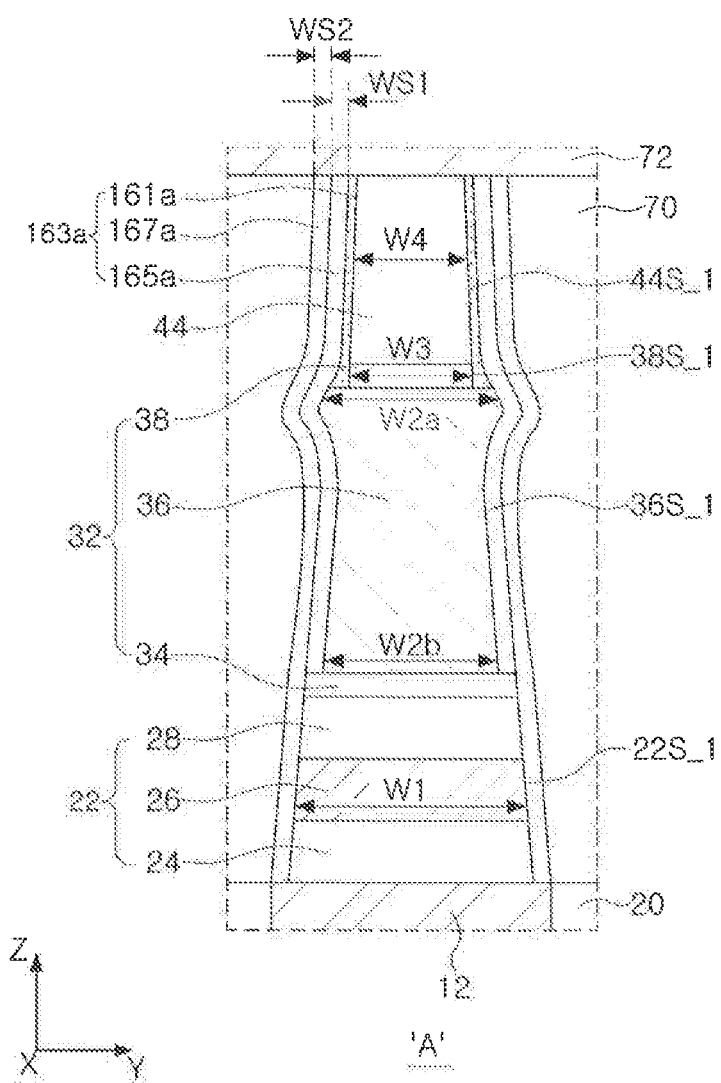
Figure 2E:
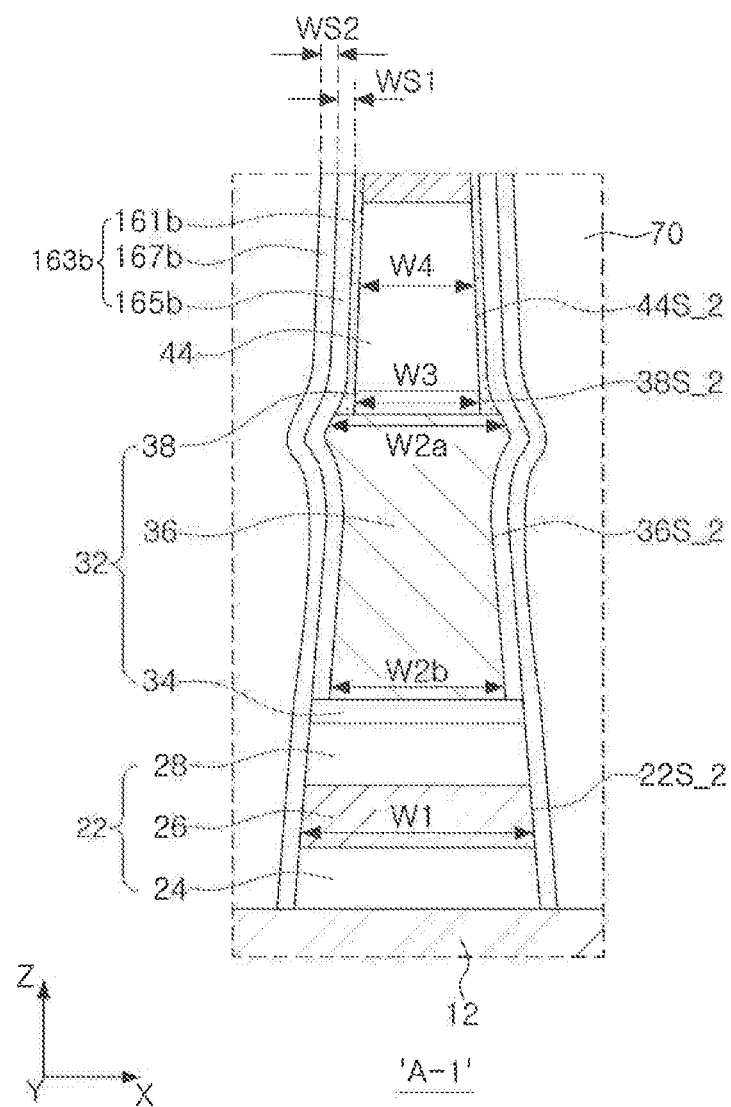

FIGS. 2D and 2E are enlarged cross-sectional diagrams illustrating a portion of a semiconductor device according to an exemplary embodiment of the present inventive concept, and the semiconductor device further includes a protective spacer. FIG. 2D illustrates a region corresponding to region "A" illustrated in FIG. 2A, and FIG. 2E illustrates a region corresponding to region "A-1" illustrated in FIG. 2A.

Referring to FIG. 2D, first spacer structures 163a may include a first spacer 165a adjacent to the first memory cell structure MC1, a second spacer 167a adjacent to the first insulating pattern 70, and a first protective spacer 161a disposed between the first spacer 165a and the first memory cell structure MC1.

The first protective spacer 161a may extend from the data storage material pattern 36 in the third direction Z, and may be disposed on a first lateral surface 38S_1 of the upper electrode pattern 38 and a first lateral surface 44S_1 of the upper conductive pattern 44.

The first spacer 165a may be disposed on an external lateral surface of the first protective spacer 161a and a first lateral surface 36S_1 of the data storage material pattern 36. The first protective spacer 161a may be disposed between the first spacer 165a and the upper conductive pattern 44. For example, the first spacer 165a may be directly in contact with the first lateral surface 36S_1 of the data storage material pattern 36. The first spacer 165a may cover an edge of an upper surface of the lower electrode pattern 34.

The second spacer 167a may extend from the first conductive structure 12 in the third direction Z, and may be disposed on an external lateral surface of the first spacer 165a and a first lateral surface 22S_1 of the switching structure 22. The second spacer 167a may cover an edge of an upper surface of the first conductive structure 12.

Referring to FIG. 2E, second spacer structures 163b may include a third spacer 165b adjacent to the first memory cell structure MC1, a fourth spacer 167b adjacent to the first insulating pattern 70, and a second protective spacer 161b disposed between the third spacer 165b and the first memory cell structure MC1.

The second protective spacer 161b may extend from the data storage material pattern 36 in the third direction Z, and may be disposed on a second lateral surface 38S_2 of the upper electrode pattern 38 and a second lateral surface 44S_2 of the upper conductive pattern 44.

The third spacer 165b may be disposed on an external lateral surface of the second protective spacer 161b and a second lateral surface 36S_2 of the data storage material pattern 36. The second protective spacer 161b may be disposed between the third spacer 165b and the upper conductive pattern 44. For example, the third spacer 165b may be directly in contact with a second lateral surface 36S_2 of the data storage material pattern 36. The third spacer 165b may cover an edge of an upper surface of the lower electrode pattern 34.

The fourth spacer 167b may extend from the first conductive structure 12 in the third direction Z, and may be disposed on an external lateral surface of the third spacer 165b and a second lateral surface 22S_2 of the switching structure 22. The fourth spacer 167b may cover an edge of an upper surface of the first conductive structure 12.

The first and second protective spacers 161a and 161b may be referred to as protective spacers.

In the description below, a two-stack structure in which the memory cell structures MC1 and MC2 are stacked in the third direction Z will be described with reference to FIG. 2A. The second memory cell structure MC2 may have a structure formed by rotating the first memory cell structure MC1 by, for example, 90 degrees on a plane. Accordingly, in FIG. 2A, the second memory cell structure MC2 in the region marked by line may have a structure substantially the same as a structure of the first memory cell structure MC1 in the region marked by line II-II', and the second memory cell structure MC2 in the region marked by line II-II' may have may have a structure substantially the same as a structure of the first memory cell structure MC1 in the region marked by line I-I'.

In the description below, one or more exemplary embodiments of the present inventive concept will be described with reference to FIGS. 3A to 7. In the descriptions of one or more exemplary embodiments of the present inventive concept, only modified portions of the semiconductor device described in the aforementioned exemplary embodiment of the present inventive concept with reference to FIGS. 2A to 2E will be described. Thus, other elements and portions of the modified exemplary embodiments of the present inventive concept may be understood from the aforementioned exemplary embodiment described with reference to FIGS. 2A to 2E unless otherwise indicated.

Figure 3A:
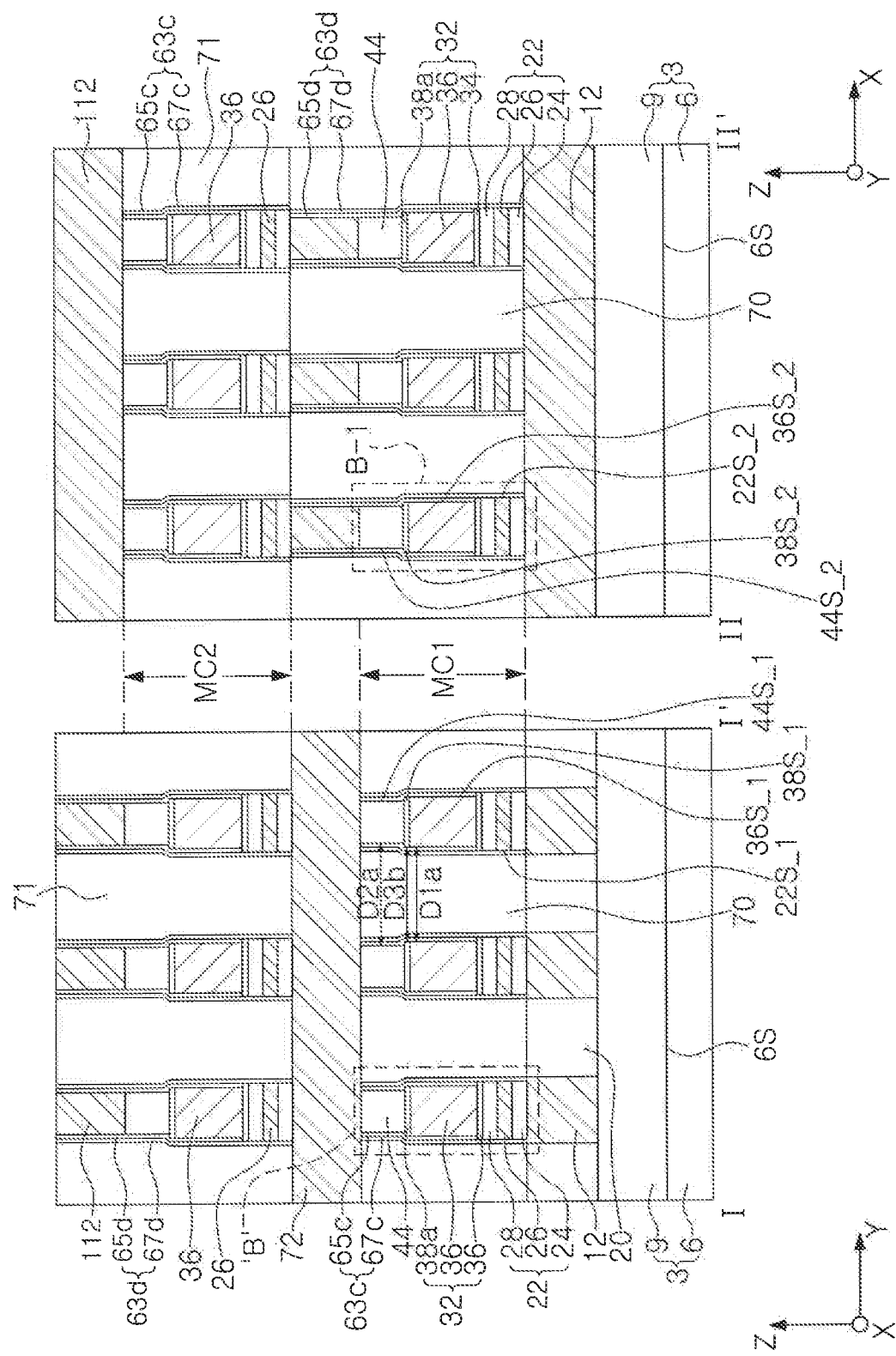
FIG. 3A is a cross-sectional diagram illustrating a semiconductor device according to an exemplary embodiment of the present inventive concept.
Figure 3B:
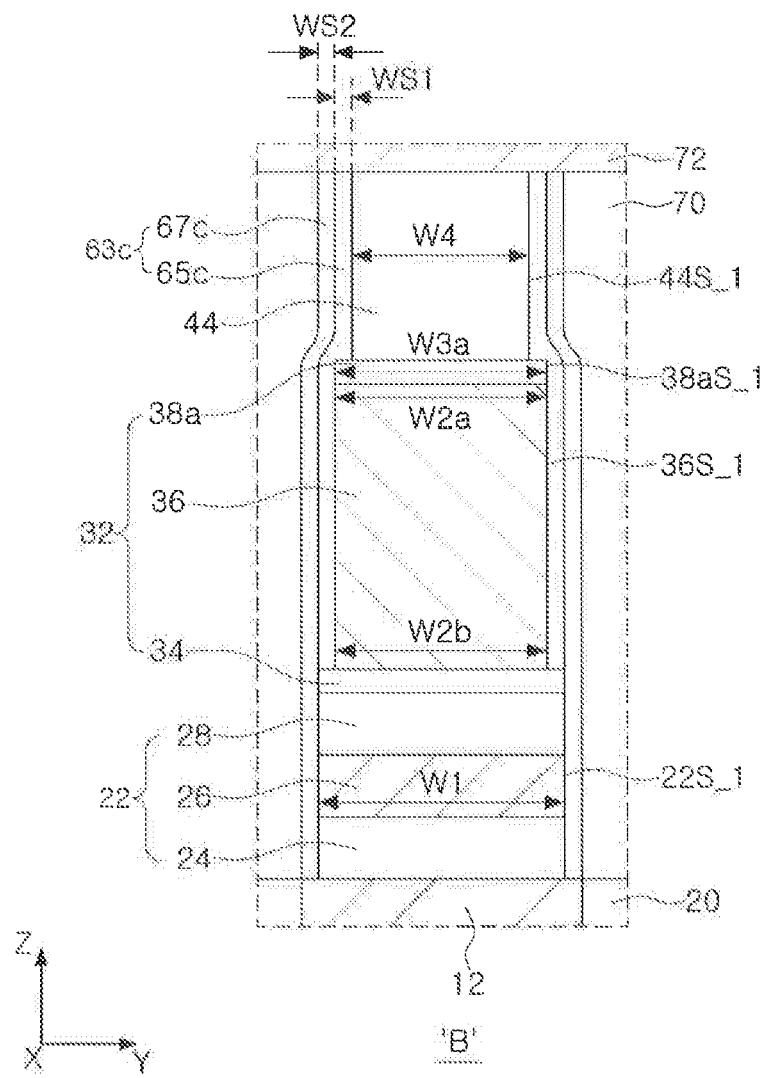
FIGS. 3B, 3C, 3D and 3E are enlarged cross-sectional diagrams illustrating a portion of a semiconductor device according to an exemplary embodiment of the present inventive concept.
Figure 3C:
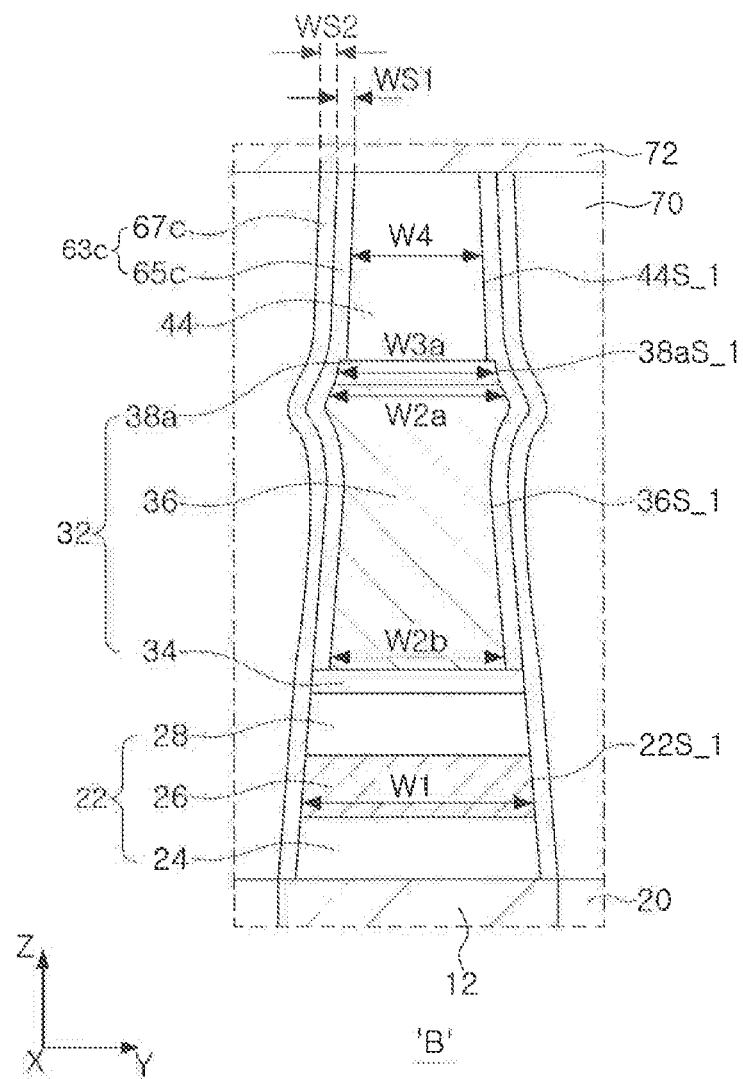

FIG. 3A is a cross-sectional diagram illustrating cross-sectional surfaces of the semiconductor device taken along lines I-I' and II-II' in FIG. 1 according to an exemplary embodiment of the present inventive concept, and FIGS. 3B and 3C are enlarged diagrams illustrating region "B" illustrated in FIG. 3A according to an exemplary embodiment of the present inventive concept.

Referring to FIG. 3A, a maximum value of a third distance D3b may be smaller than a minimum value of a second distance D2a, and a minimum value of the third distance D3b may be substantially the same as a first distance D1a.

The description of the third distance D3b may be applied in both the first and second directions X and Y.

As illustrated in FIG. 3B, a first spacer 65c may cover an edge of an upper surface of an upper electrode pattern 38a. The first spacer 65c may have a curved shape to surround an end of an upper surface of the upper electrode pattern 38a.

As illustrated in FIG. 3B, a sum of widths of edges of both sides of the upper surface of the upper electrode pattern 38a, covered by the first spacer 65c may be substantially the same as a difference between a third width W3a and a fourth width W4.

A second spacer 67c may have a curved shape to surround an end of an upper surface of the upper electrode pattern 38a.

The descriptions of the first spacer 65c and the second spacer 67c may also be applied to a third spacer 65d and a fourth spacer 67d.

Referring to FIGS. 3B and 3C, the upper electrode pattern 38a may have the third width W3a, and a minimum value of the third width W3a may be substantially the same as a width W2a of an upper region. A minimum value of the third width W3a may be greater than a maximum value of the fourth width W4.

The description of the third width W3a may be applied in both the first and second directions X and Y.

In an exemplary embodiment of the present inventive concept, a first lateral surface 38aS_1 of the upper electrode pattern 38a and a first lateral surface 36S_1 of a data storage material pattern 36 may be substantially coplanar with each other. The first lateral surface 38aS_1 of the upper electrode pattern 38a and the first lateral surface 36S_1 of a data storage material pattern 36 may be self-aligned.

Figure 3D:
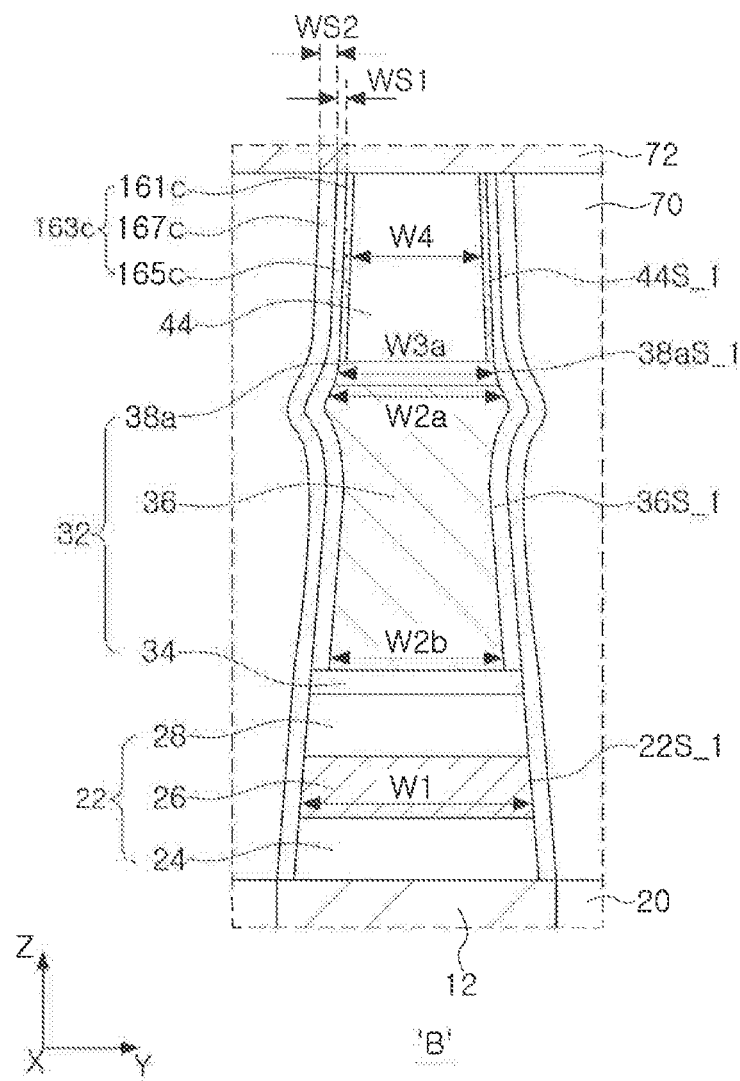
Figure 3E:
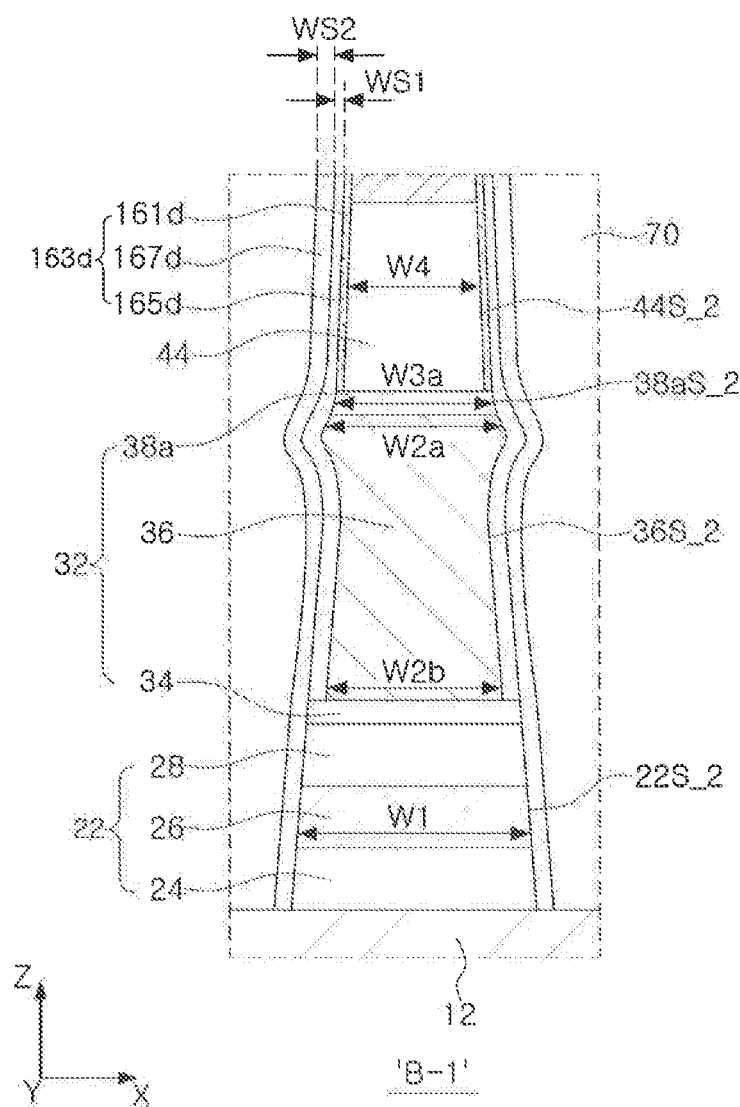

FIGS. 3D and 3E are enlarged cross-sectional diagrams illustrating a portion of a semiconductor device, according to an exemplary embodiment of the present inventive concept, further including a protective spacer. FIG. 3D illustrates a region corresponding to region "B" illustrated in FIG. 3A, and FIG. 3E illustrates a region corresponding to region "B-1" illustrated in FIG. 3A.

Referring to FIGS. 3D and 3E, first spacer structures 163c may include a first spacer 165c adjacent to a first memory cell structure MC1, a second spacer 167c adjacent to a first insulating pattern 70, and a first protective spacer 161c disposed between the first spacer 165c and the first memory cell structure MC1.

The first protective spacer 161c may extend from the upper electrode pattern 38a in the third direction Z, and may be disposed on a first lateral surface 44S_1 of the upper conductive pattern 44.

The first spacer 165c may be disposed on an external lateral surface of the first protective spacer 161c and a first lateral surface 36S_1 of the data storage material pattern 36. The first protective spacer 161c may be disposed between the first spacer 165c and the upper conductive pattern 44. The first spacer 165c may cover an edge of an upper surface of the lower electrode pattern 34.

The second spacer 167c may extend from the first conductive structure 12 in the third direction Z, and may be disposed on an external lateral surface of the first spacer 165e and a first lateral surface 22S_1 of a switching structure 22. The second spacer 167c may cover an edge of an upper surface of the first conductive structure 12.

The descriptions of the first spacer 165c, the second spacer 167c, and the first protective spacer 161c may also be applied to a third spacer 165d, a fourth spacer 167d, and a second protective spacer 161d (in, e.g., FIG. 3E).

Figure 4A:
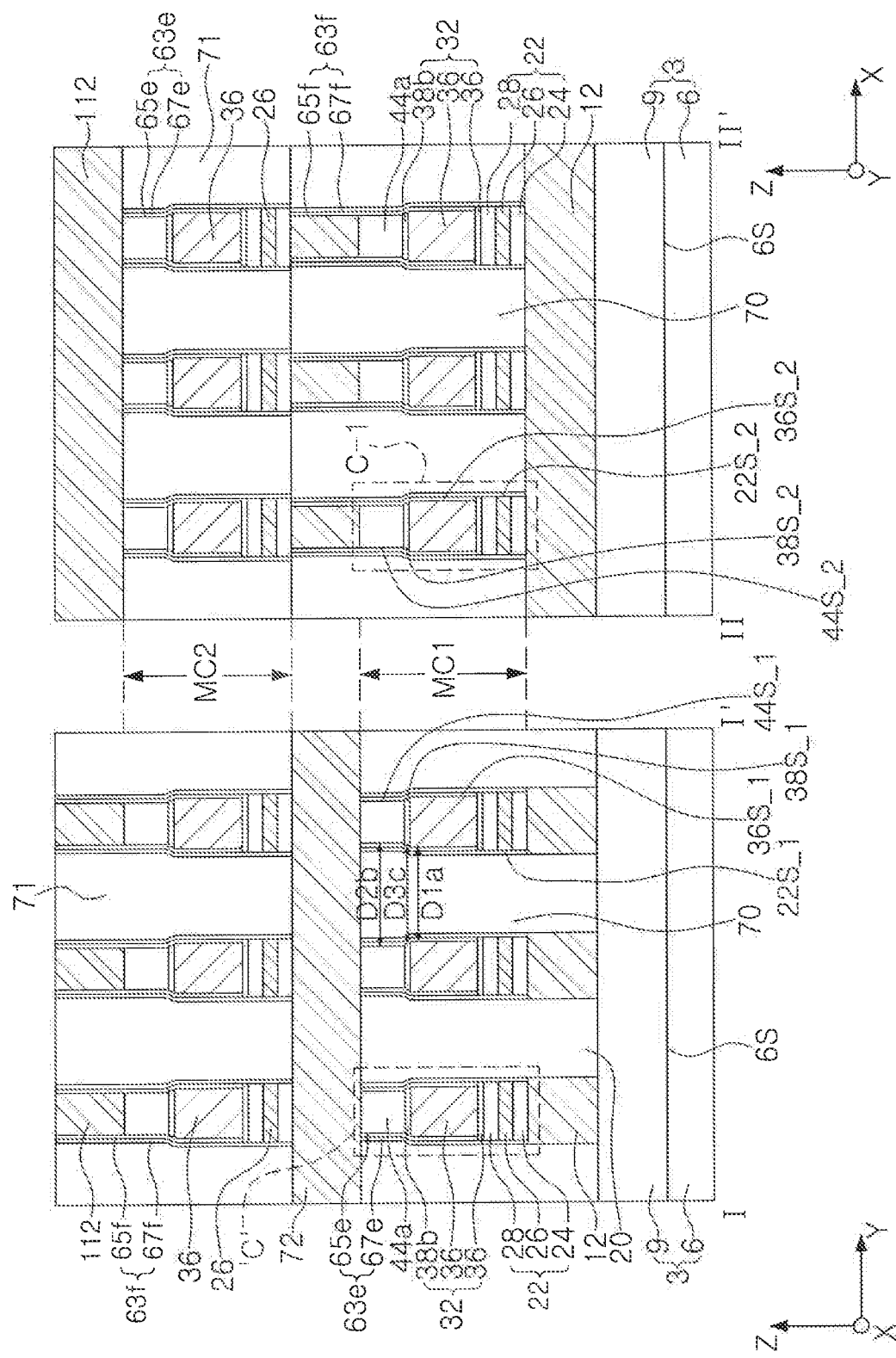
FIG. 4A is a cross-sectional diagram illustrating a semiconductor device according to an exemplary embodiment of the present inventive concept.
Figure 4B:
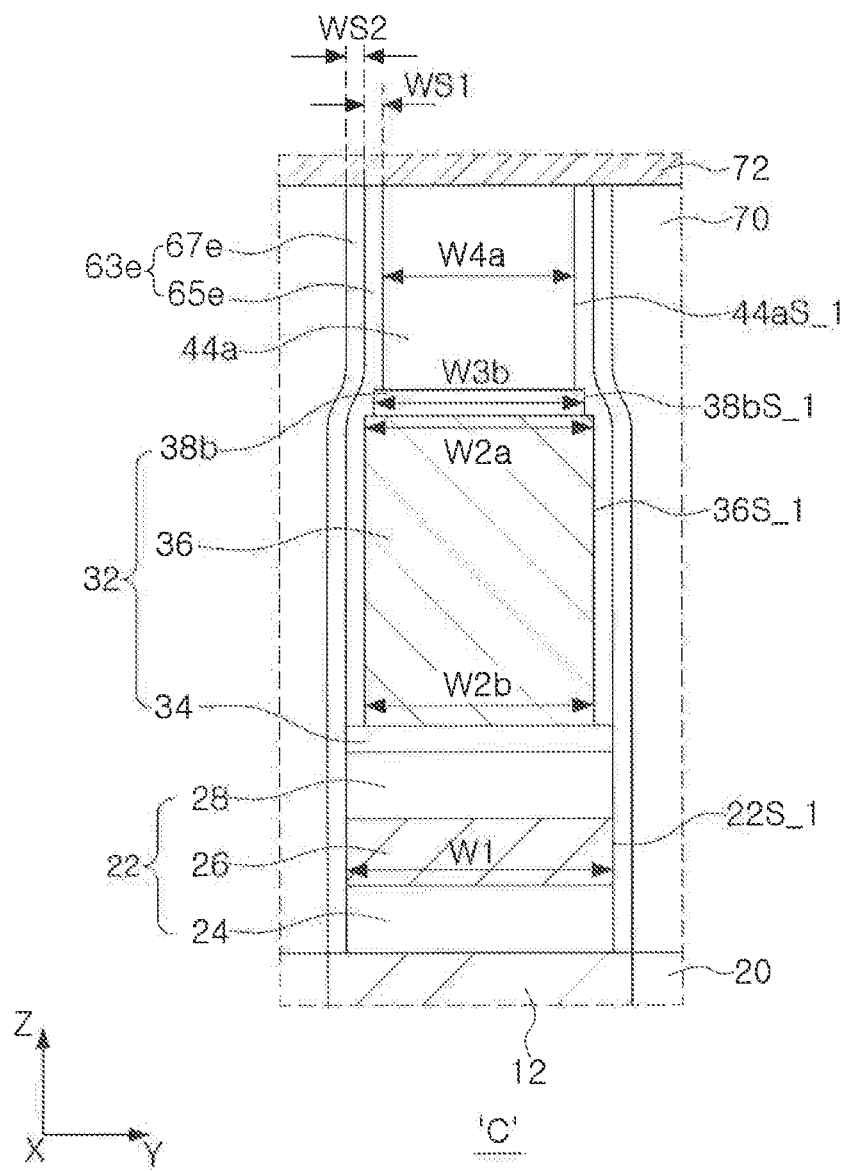
FIGS. 4B, 4C, 4D and 4E are enlarged cross-sectional diagrams illustrating a portion of a semiconductor device according to an exemplary embodiment of the present inventive concept.
Figure 4C:
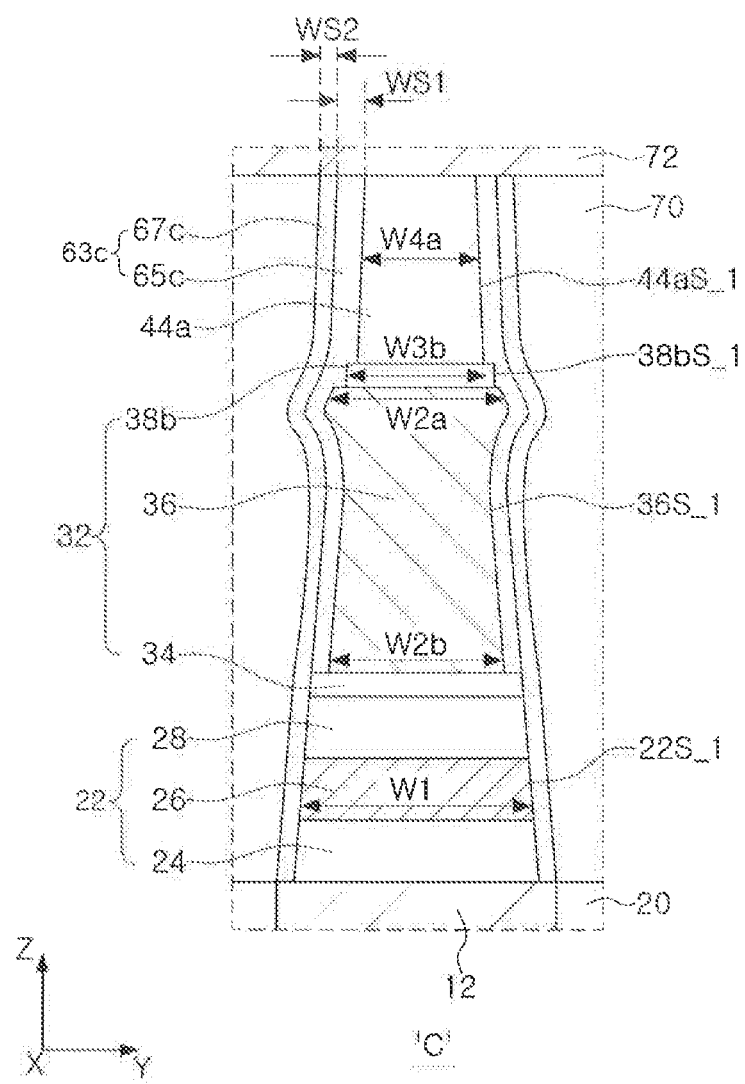

FIG. 4A is a cross-sectional diagram illustrating cross-sectional surfaces of a semiconductor device taken along lines I-I' and II-II' in FIG. 1 according to an exemplary embodiment of the present inventive concept. FIGS. 4B and 4C are enlarged diagrams illustrating region "C" illustrated in FIG. 4A according to an exemplary embodiment of the present inventive concept.

Referring to FIG. 4A, a minimum value of a second distance D2b may be greater than a first distance D1a.

In an exemplary embodiment of the present inventive concept, a minimum value of a third distance D3b may be greater than the third distance D3b. A maximum value of the third distance D3b may be less than a minimum value of the second distance D2b.

The descriptions of the second distance D2a and the third distance D3b may be applied in both the first and second directions X and Y.

As illustrated in FIG. 4B, a first spacer 65e may cover an edge of an upper surface of a data storage material pattern 36 and an edge of an upper surface of an upper electrode pattern 38b. The first spacer 65e may have a curved shape to surround an end of an upper surface of the data storage material pattern 36 and an end of an upper surface of the upper electrode pattern 38b.

As illustrated in FIG. 4B, a sum of widths of edges of both sides of the upper surface of the data storage material pattern 36 and widths of edges of both sides of an upper surface of the upper electrode pattern 38b may be substantially the same as a difference between a width W2a of an upper region and a fourth width W4a.

A second spacer 67e may have a curved shape to surround an end of an upper surface of the data storage material pattern 36 and an end of an upper surface of the upper electrode pattern 38b.

The descriptions of the first spacer 65e and the second spacer 67e may also be applied to a third spacer 65f and a fourth spacer 67f.

Referring to FIGS. 4B and 4C, an upper electrode pattern 38b may have a third width W3b, and a maximum value of the third width W3b may be less than a width W2a of the upper region of the data storage material pattern 36.

In an exemplary embodiment of the present inventive concept, an upper conductive pattern 44a may have a fourth width W4a, and a maximum value of the fourth width W4a may be less than a minimum value of the third width W3b. A maximum value of the third width W3b may be less than the width W2a of the upper region of the data storage material pattern 36.

The descriptions of the third width W3b and the fourth width W4a may be applied in both the first and second directions X and Y.

In an exemplary embodiment of the present inventive concept, a first lateral surface 44aS_1 of the upper conductive pattern 44a, a first lateral surface 38bS_1 of the upper electrode pattern 38b, and a first lateral surface 36S_1 of the data storage material pattern 36 may not be coplanar with one another.

Figure 4D:
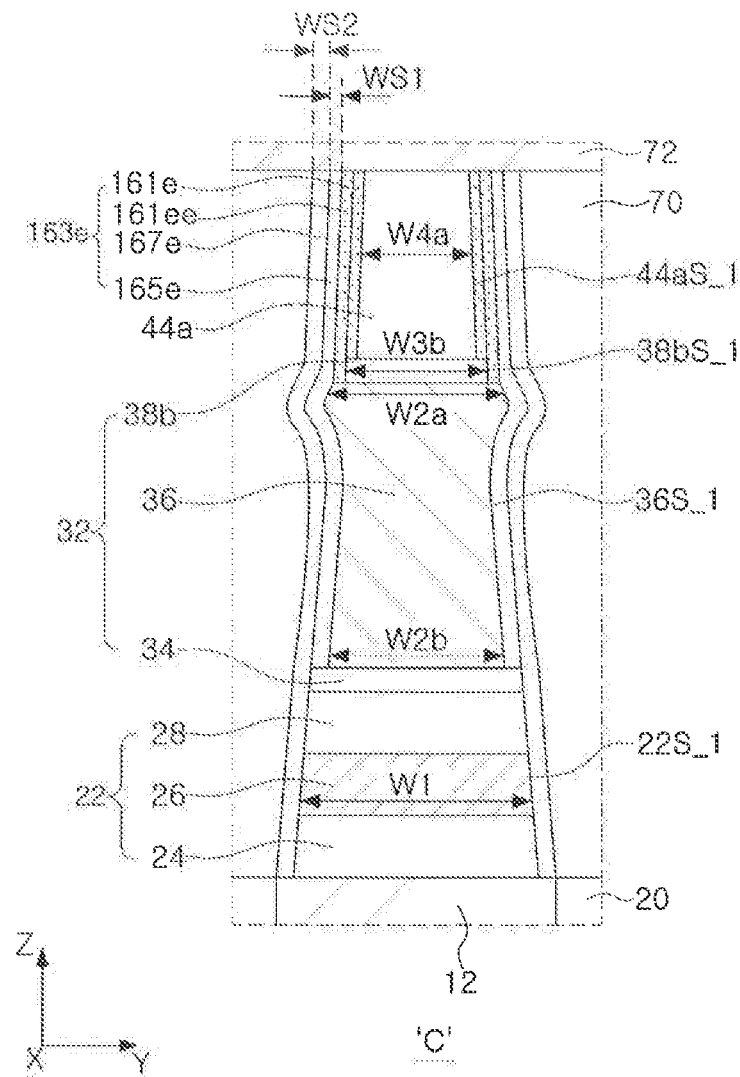
Figure 4E:
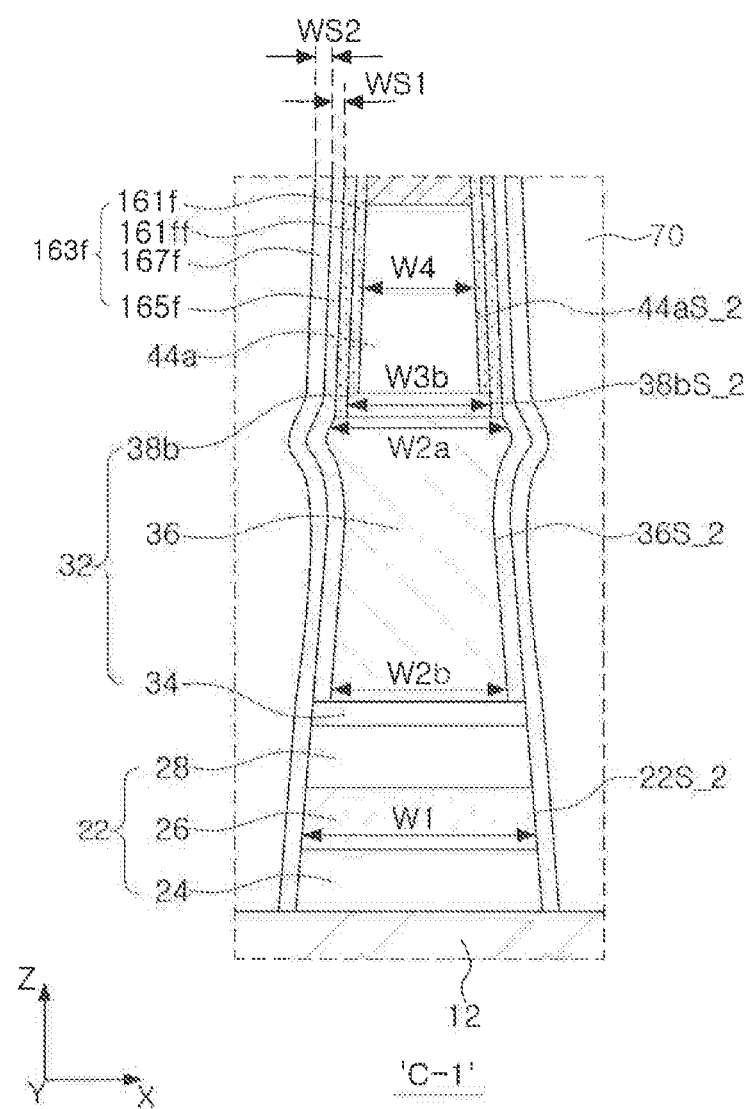

FIGS. 4D and 4E are enlarged cross-sectional diagrams illustrating a portion of a semiconductor device, according to an exemplary embodiment of the present inventive concept, further including protective spacers.

Referring to FIGS. 4D and 4E, first spacer structures 163e may include a first spacer 165e adjacent to first memory cell structures MC1, a second spacer 167e adjacent to a first insulating pattern 70, and a first internal protective spacer 161e and a first external protective spacer 161ee disposed between the first spacer 165e and the first memory cell structures MC1.

The first internal protective spacer 161e may extend from an upper electrode pattern 38b in the third direction Z, and may be disposed on a first lateral surface 44aS_1 of the upper conductive pattern 44a.

The first external protective spacer 161ee may extend from a data storage material pattern 36 in the third direction Z, and may be disposed on the first lateral surface 44aS_1 of the upper conductive pattern 44a and on a first lateral surface 38bS_1 of the upper electrode pattern 38b.

The first internal protective spacer 161e may be disposed between the first external protective spacer 161ee and the upper conductive pattern 44a. The first external protective spacer 161ee may be disposed between the first internal protective spacer 161e and the first spacer 165e. For example, the first lateral surface 44aS_1 of the upper conductive pattern 44a may be directly in contact with the first internal protective spacer 161e. For example, the first lateral surface 38bS_1 of the upper electrode pattern 38b may be directly in contact with the first external protective spacer 161ee.

The first spacer 165e may be disposed on an external lateral surface of the first external protective spacer 161ee and a first lateral surface 36S_1 of the data storage material pattern 36. The first spacer 165e may cover an edge of an upper surface of a lower electrode pattern 34.

The second spacer 167e may extend from a first conductive structure 12 in the third direction Z, and may be disposed on an external lateral surface of the first spacer 165e and a first lateral surface 22S_1 of a switching structure 22. The second spacer 167e may cover an edge of an upper surface of the first conductive structure 12.

The descriptions of the first spacer 165e, the second spacer 167e, the first internal protective spacer 161e, and the first external protective spacer 161ee may also be applied to a third spacer 165f, a fourth spacer 167f, a second internal protective spacer 161f, and a second external protective spacer 161ff.

Figure 5:
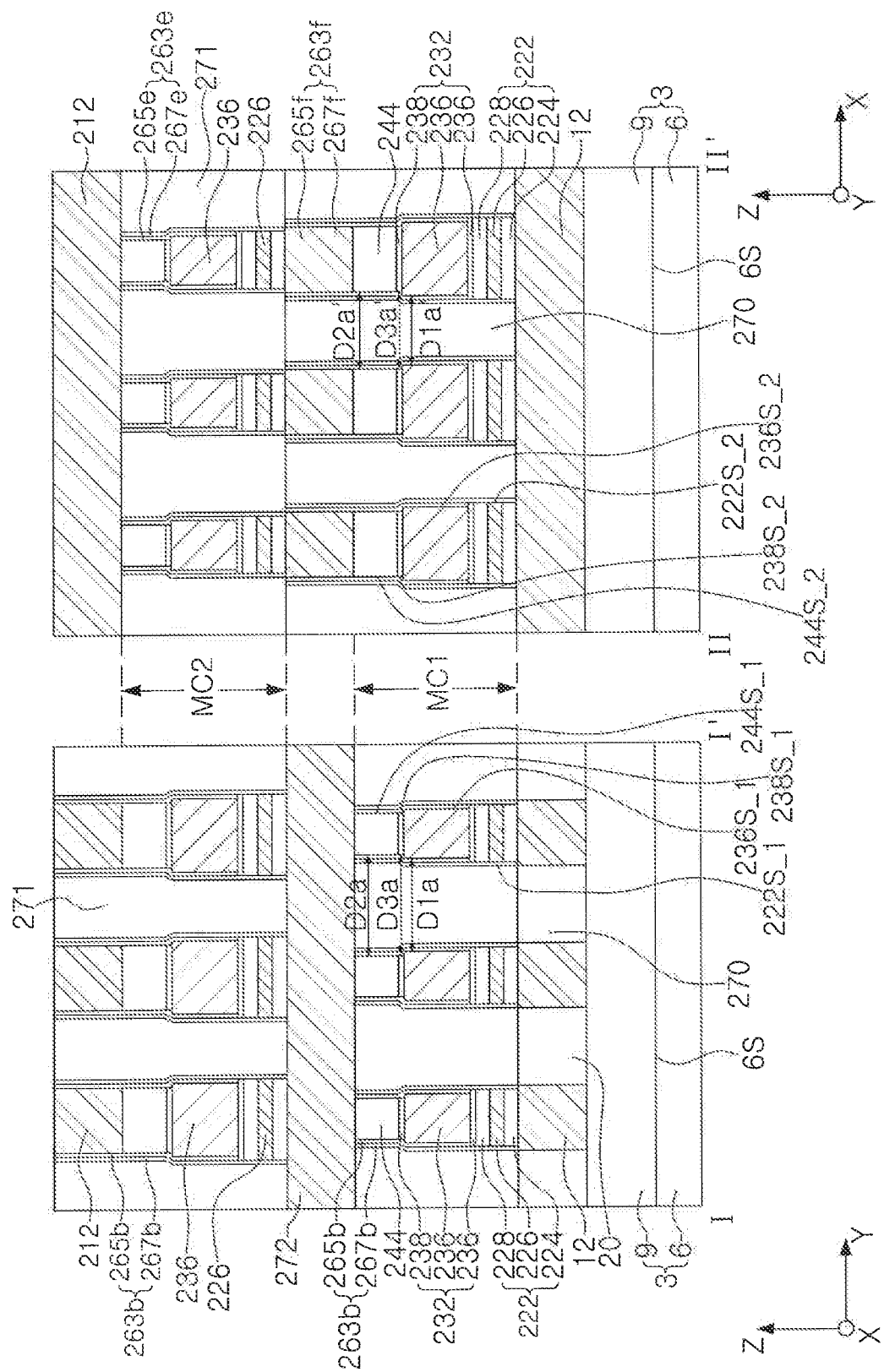
FIG. 5 is a cross-sectional diagram illustrating a semiconductor device according to an exemplary embodiment of the present inventive concept.
Figure 6:
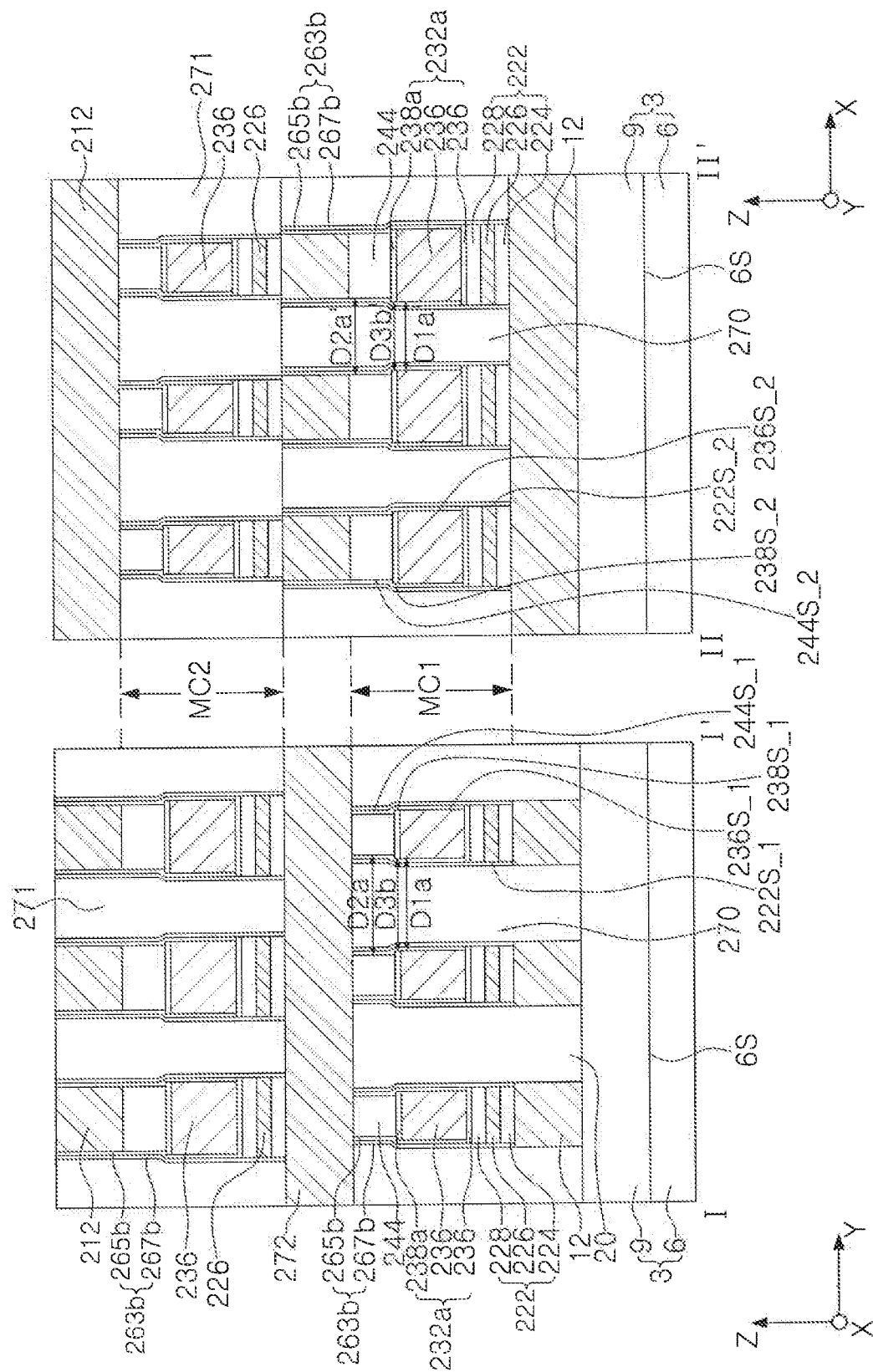
FIG. 6 is a cross-sectional diagram illustrating a semiconductor device according to an exemplary embodiment of the present inventive concept.
Figure 7:
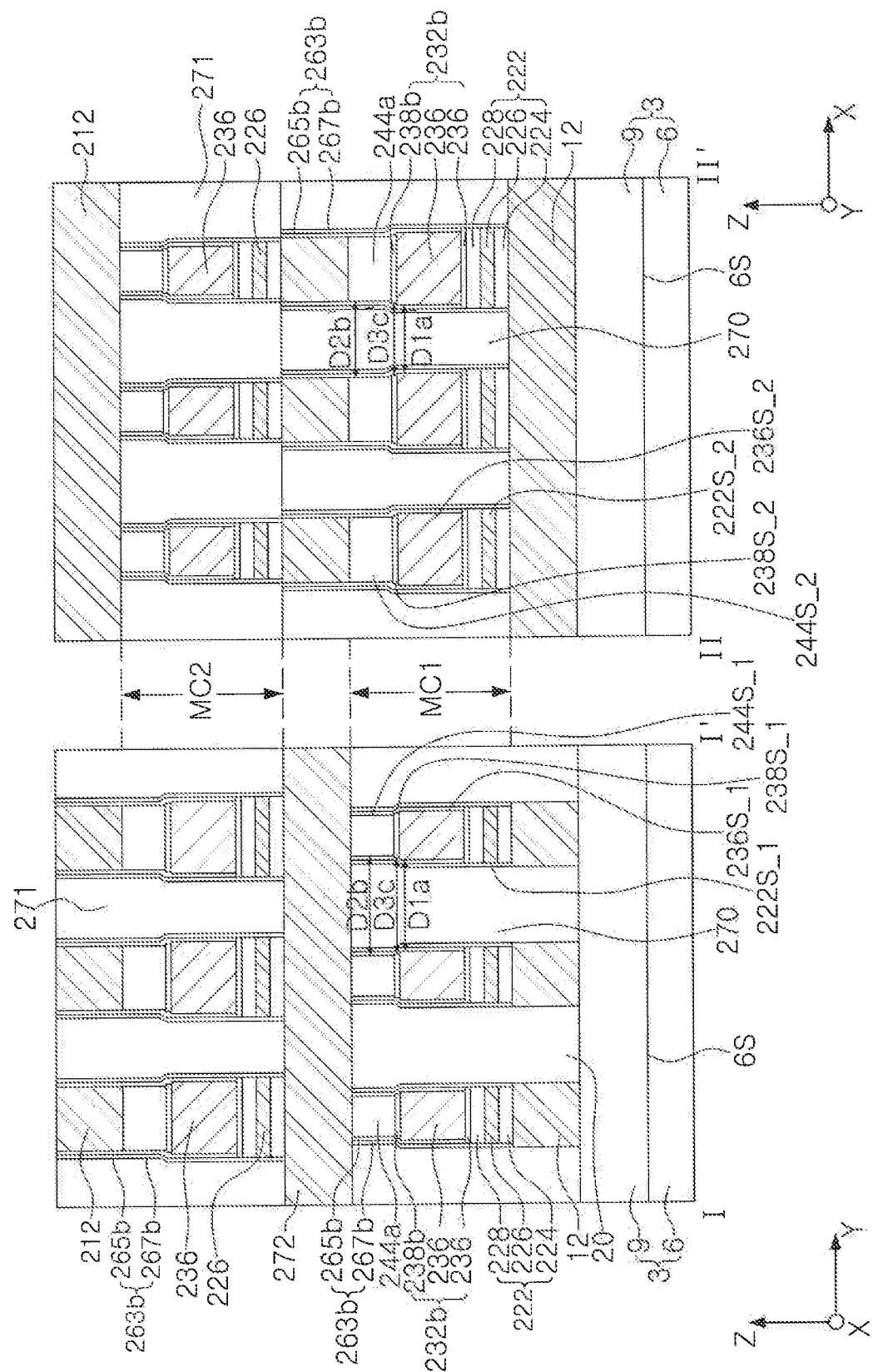
FIG. 7 is a cross-sectional diagram illustrating a semiconductor device according to an exemplary embodiment of the present inventive concept.
Figure 8:
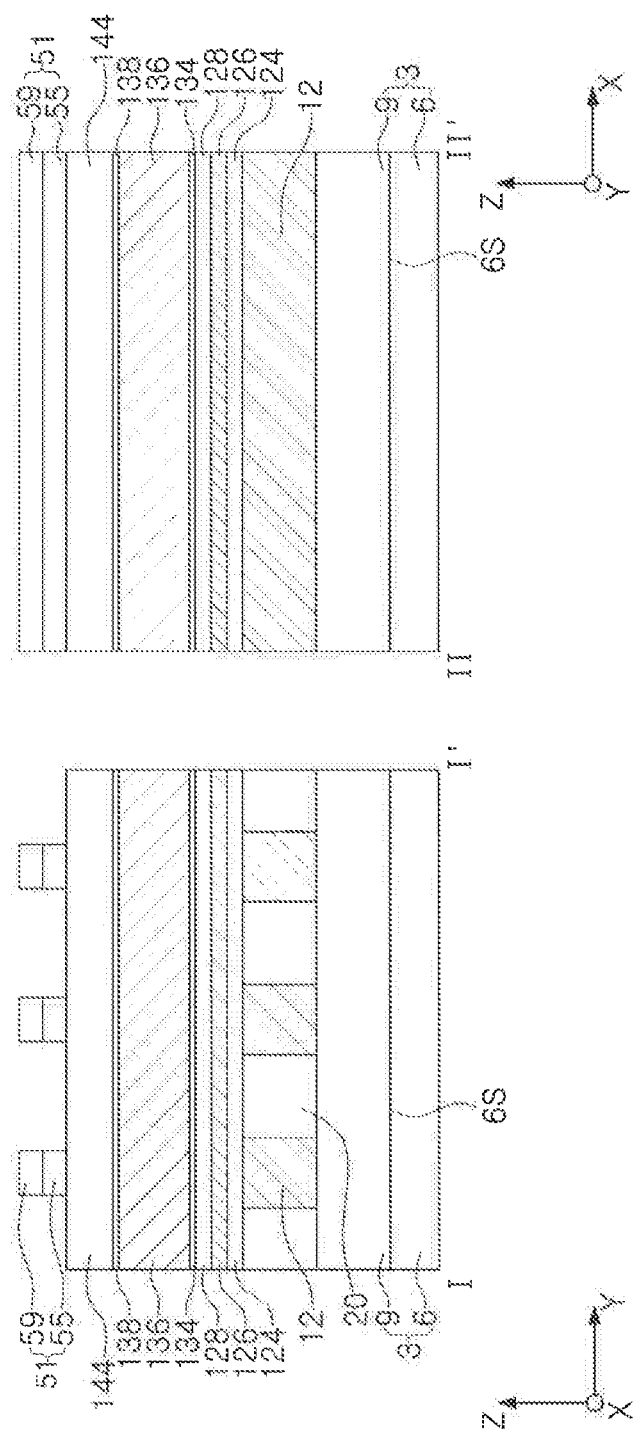
FIGS. 8, 9, 10, 11, 12, 13, 14, 15, 16, 17, 18, 19, 20, 21, 22, 23, 24, 25 and 26 are cross-sectional diagrams illustrating a method of manufacturing a semiconductor device according to an exemplary embodiment of the present inventive concept.
Figure 9:
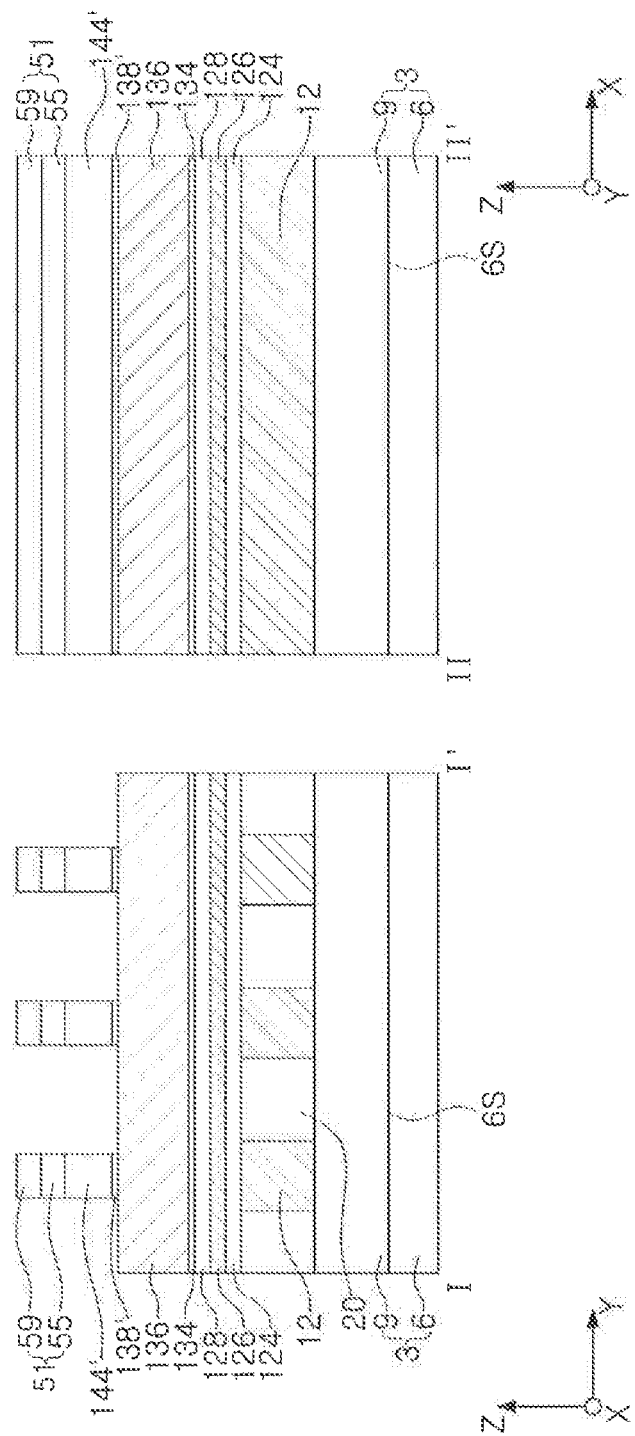

FIGS. 5 to 7 are cross-sectional diagrams illustrating cross-sectional surfaces of a semiconductor device taken along lines I-I' and II-II' in FIG. 1 according to an exemplary embodiment of the present inventive concept.

Referring to FIGS. 2A and 5, each of a second memory cell structure MC2 in a region marked by line I-I' in FIG. 5 and a first memory cell structure MC1 in a region marked by line II-II' in FIG. 5 may have a structure different from a structure of each of the memory cell structures in FIG. 2A.

In an exemplary embodiment of the present inventive concept, a width of a switching structure 222 in the first direction X may be greater than a width of the switching structure 222 in the second direction Y. For example, the switching structure 222 may include a switching material pattern 226, and a width of the switching material pattern 226 in the first direction X may be greater than width of the switching material pattern 226 in the second direction Y.

In an exemplary embodiment of the present inventive concept, a width of a data storage structure 232 in the first direction X may be greater than a width of the data storage structure 232 in the second direction Y. For example, the data storage structure 232 may include a data storage material pattern 236, and a width of the data storage material pattern 236 in the first direction X may be greater than a width of the data storage material pattern 236 in the second direction Y.

In an exemplary embodiment of the present inventive concept, a first distance D1a between upper regions of the data storage material patterns 236 in the second direction Y may be greater than a first distance D1a' between upper regions of the data storage material patterns 236 in the first direction X.

In an exemplary embodiment present inventive concept, a second distance D2a between upper conductive patterns 244 adjacent to each other in the second direction Y may be greater than a second distance D2a' between upper conductive patterns 244 adjacent to each other in the first direction X.

In an exemplary embodiment of the present inventive concept, a third distance D3a between upper electrode patterns 238 adjacent to each other in the second direction Y may be greater than a third distance D3a' between upper electrode patterns 238 adjacent to each other in the first direction X.

In an exemplary embodiment of the present inventive concept, the first distance D1a' may be less than a minimum value of the second distance D2a', and a maximum value of the third distance D3a' may be substantially the same as a minimum value of the second distance D2a'.

Referring to FIGS. 3A and 6, each of the second memory cell structure MC2 in a region marked by line I-I' in FIG. 6 and the first memory cell structure MC1 in a region marked by line II-II' in FIG. 6 may have a structure different from a structure of each of the memory cell structures in FIG. 3A.

In an exemplary embodiment of the present inventive concept, a width of a data storage structure 232a in the first direction X may be greater than a width of the data storage structure 232a in the second direction Y. For example, the data storage structure 232a may include a data storage material pattern 236, and a width of the data storage material pattern 236 in the first direction X may be greater than a width of the data storage material pattern 236 in the second direction Y.

In an exemplary embodiment of the present inventive concept, a first distance D1a between the data storage material patterns 236 adjacent to each other in the second direction Y may be greater than a first distance D1a' between the data storage material patterns 236 adjacent to each other in the first direction X.

In an exemplary embodiment of the present inventive concept, a second distance D2a between the upper conductive patterns 244 adjacent to each other in the second direction Y may be greater than a second direction D2a' between the upper conductive patterns 244 adjacent to each other in the first direction X.

In an exemplary embodiment of the present inventive concept, a third distance D3b between upper electrode patterns 238 adjacent to each other in the second direction Y may be greater than a third distance D3b' between upper electrode patterns 238 adjacent to each other in the first direction X.

In an exemplary embodiment of the present inventive concept, a maximum value of the third distance D3b' may be greater than a minimum value of the second distance D2a', and a minimum value of the third distance D3b' may be substantially the same as the first distance D1a'.

Referring to FIGS. 4A and 7, each of the second memory cell structure MC2 in a region marked by line I-I' in FIG. 7 and the first memory cell structure MC1 in a region marked by line II-II' in FIG. 7 may have a structure different from the structure of each of the memory cell structures in FIG. 4A.

In an exemplary embodiment of the present inventive concept, a width of a data storage structure 232b in the first direction X may be greater than a width of the data storage structure 232b in the second direction Y. For example, the data storage structure 232b may include a data storage material pattern 236, and a width of the data storage material pattern 236 in the first direction X may be greater than a width of the data storage material pattern 236 in the second direction Y.

In an exemplary embodiment of the present inventive concept, a first distance D1a between the data storage material patterns 236 adjacent to each other in the second direction Y may be greater than a first distance D1a' between the data storage material patterns 236 adjacent to each other in the first direction X.

In an exemplary embodiment of the present inventive concept, a second distance D2b between the upper conductive patterns 244 adjacent to each other in the second direction Y may be greater than a second distance D2b' in the first direction X.

In an exemplary embodiment of the present inventive concept, a third distance D3c between upper electrode patterns 238 adjacent to each other in the second direction V may be greater than a third distance D3c' between upper electrode patterns 238 adjacent to each other in the first direction X.

In an exemplary embodiment of the present inventive concept, the second distance D2b' may be greater than the first distance D1a'. For example, a minimum value of the second distance D2b' may be greater than a minimum value of the first distance D1a'.

In an exemplary embodiment of the present inventive concept, a minimum value of the third distance D3c' may be greater than the first distance D1a', and a maximum value of the third distance D3c' may be less than a minimum value of the second direction D2b'.

Each of the switching structure 22, the data storage structure 32, and the upper conductive pattern 44 included in the memory cell structures MC1 and MC2 of the semiconductor device described with reference to FIGS. 1 to 7 above may have a sloped lateral surface, a width of an upper portion of which is narrower than a width of a lower portion, in accordance with an aspect ratio. However, the present inventive concept is not limited thereto.

In the description below, a method of manufacturing a semiconductor device will be described in accordance with an exemplary embodiment of the present inventive concept with reference to FIGS. 1 and 8 to 26. FIGS. 8 to 27 are cross-sectional diagrams illustrating regions taken along lines I-I' and II-II' in FIG. 1 according to an exemplary embodiment of the present inventive.

In the description below, a process of etching a cell stack in the first direction X will be described.

Referring to FIGS. 1 to 8, a base structure 3 may include a semiconductor substrate 6 and a lower circuit region 9 on the semiconductor substrate 6. The lower circuit region 9 may be a peripheral circuit region. A first conducive structure 12 extending in the first direction X may be disposed on the base structure 3. A gap-fill insulating pattern 20 may be formed on lateral surfaces of the first conductive structure 12. The gap-fill insulating pattern 20 may be formed of an insulating material such as silicon oxide, or the like.

A plurality of layers in parallel to an upper surface 6s of the semiconductor substrate 6 and extending in the first and second directions X and Y may be formed on the first conductive structure 12 and the gap-fill insulating pattern 20. The plurality of layers may include a lower conductive layer 124, a switching material layer 126, an intermediate conductive layer 128, a lower electrode layer 134, a data storage material layer 136, an upper electrode layer 138, and an upper conductive layer 144 stacked in that order.

First mask patterns 51 each having a linear shape extending in the first direction X may be formed on an upper surface of the upper conductive layer 144. The first mask patterns 51 may include a polysilicon layer 55 and a silicon oxide layer 59 stacked in that order.

Referring to FIGS. 1 to 9, partial regions of the upper conductive layer 144 and the upper electrode layer 138 may be removed using an etching process. Regions which are not removed by the etching process may remain as an upper conductive line 144' and an upper electrode line 138'. Each of the upper conductive line 144' and the upper electrode line 138' may have a linear shape extending in the first direction X. As a partial region of the upper electrode layer 138 on the data storage material layer 136 is removed, a portion of an upper surface of the data storage material layer 136 may be exposed.

Figure 10:
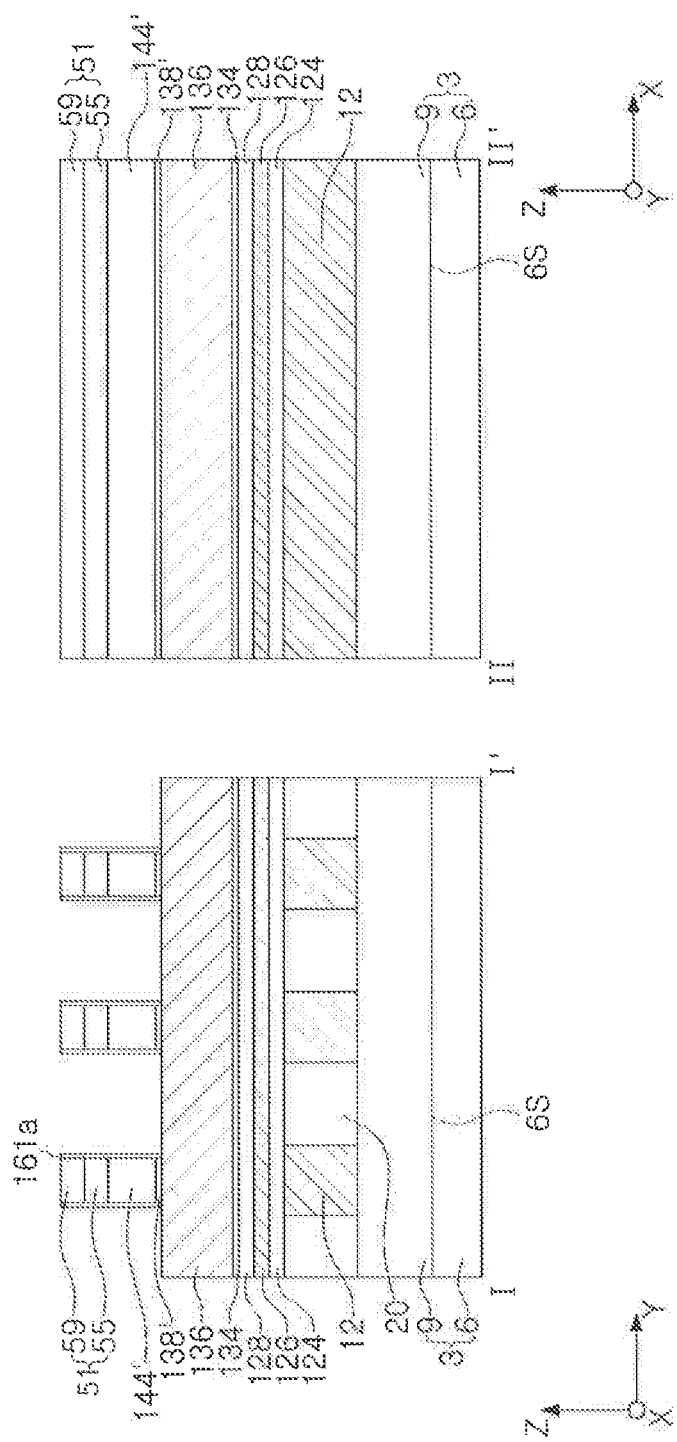

Referring to FIG. 10, a first protective spacer 161a covering a lateral surface of the upper conductive line 144', a lateral surface of the upper electrode line 138', and lateral surfaces of the first mask patterns 51 may be formed. The first protective spacer 161a may extend from a portion of the upper surface of the data storage material layer 136 in the third direction Z. The first protective spacer 161a may be formed of an insulating material such as silicon oxide, silicon nitride, or the like.

For example, the first protective spacer 161a may be formed using atomic layer deposition (ALD). The first protective spacer 161a may be formed by the atomic layer deposition method at a temperature of about 0° C. or higher and 250° C. or lower approximately. A width of the first protective spacer 161a may be varied according to an exemplary embodiment of the present inventive concept.

Before the first protective spacer 161a is formed, an acid-based cleaning process or an alkali-based cleaning process may be performed.

Figure 11:
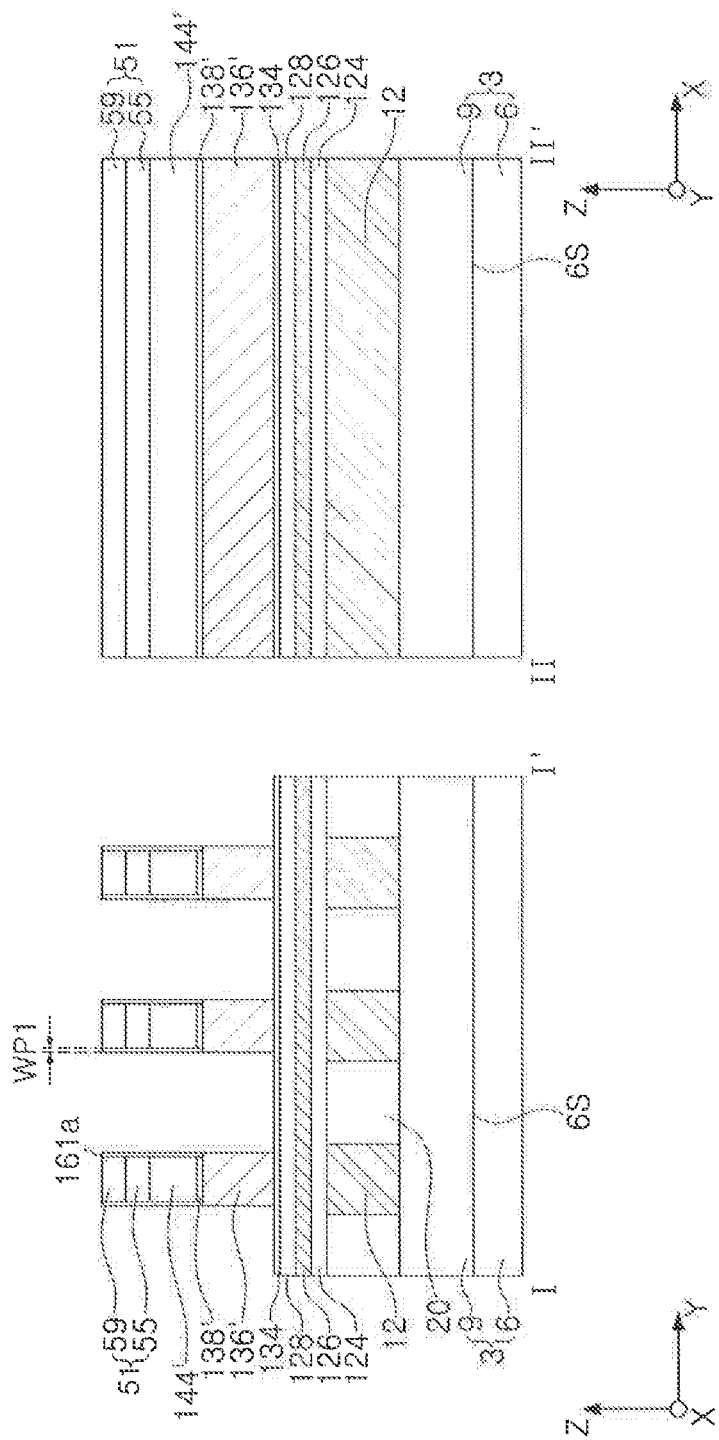
Figure 12:
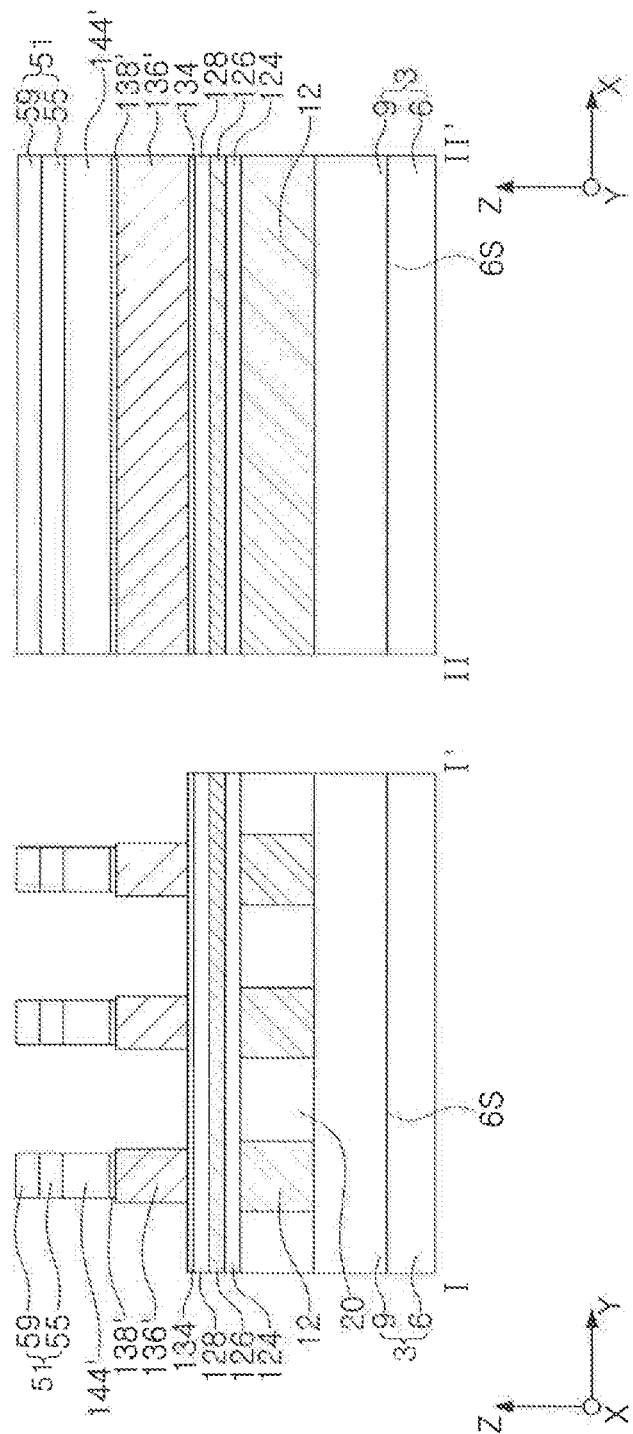
Figure 13:
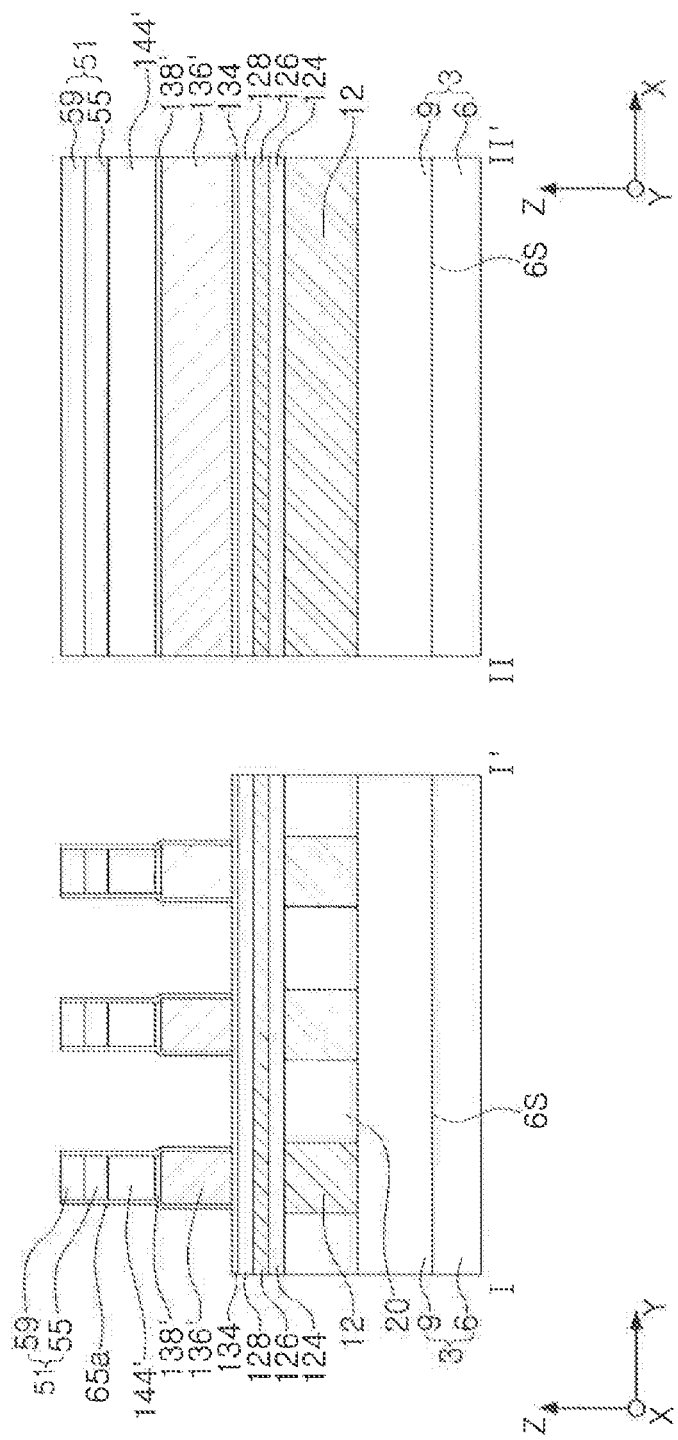
Figure 14:
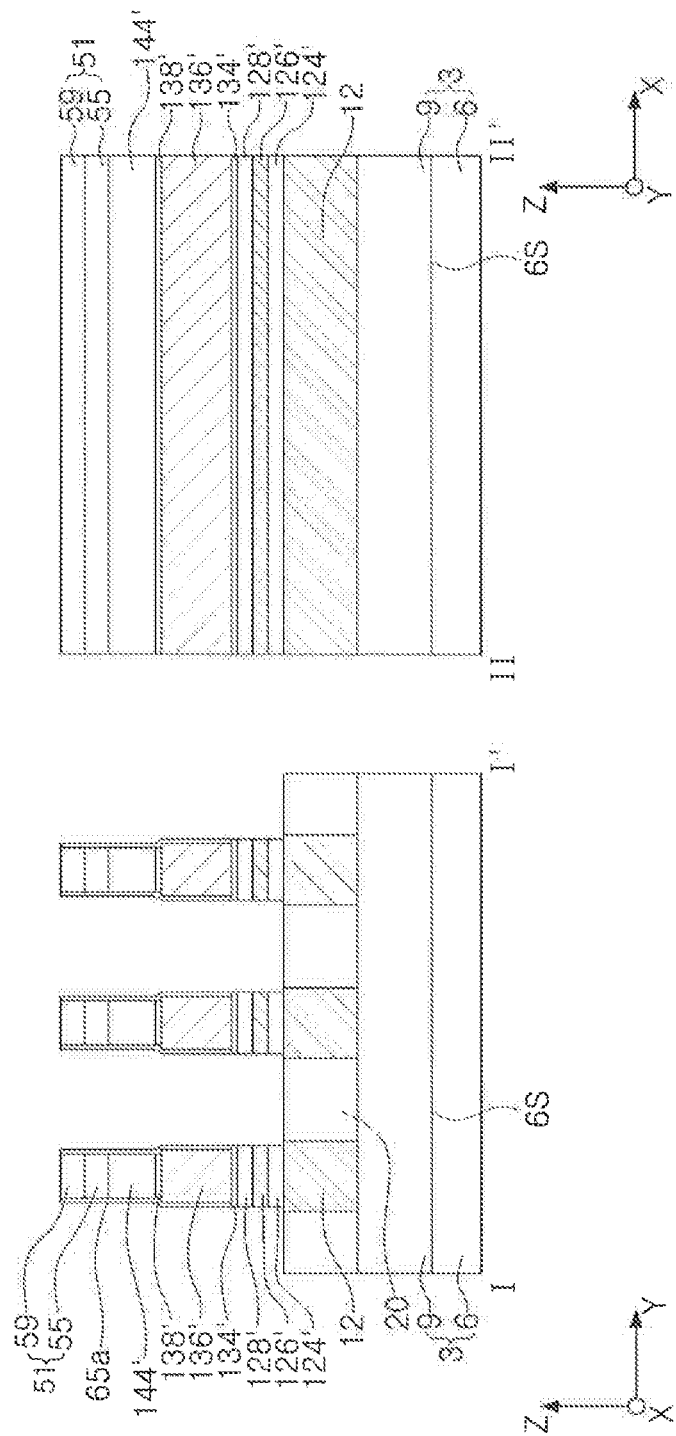
Figure 15:
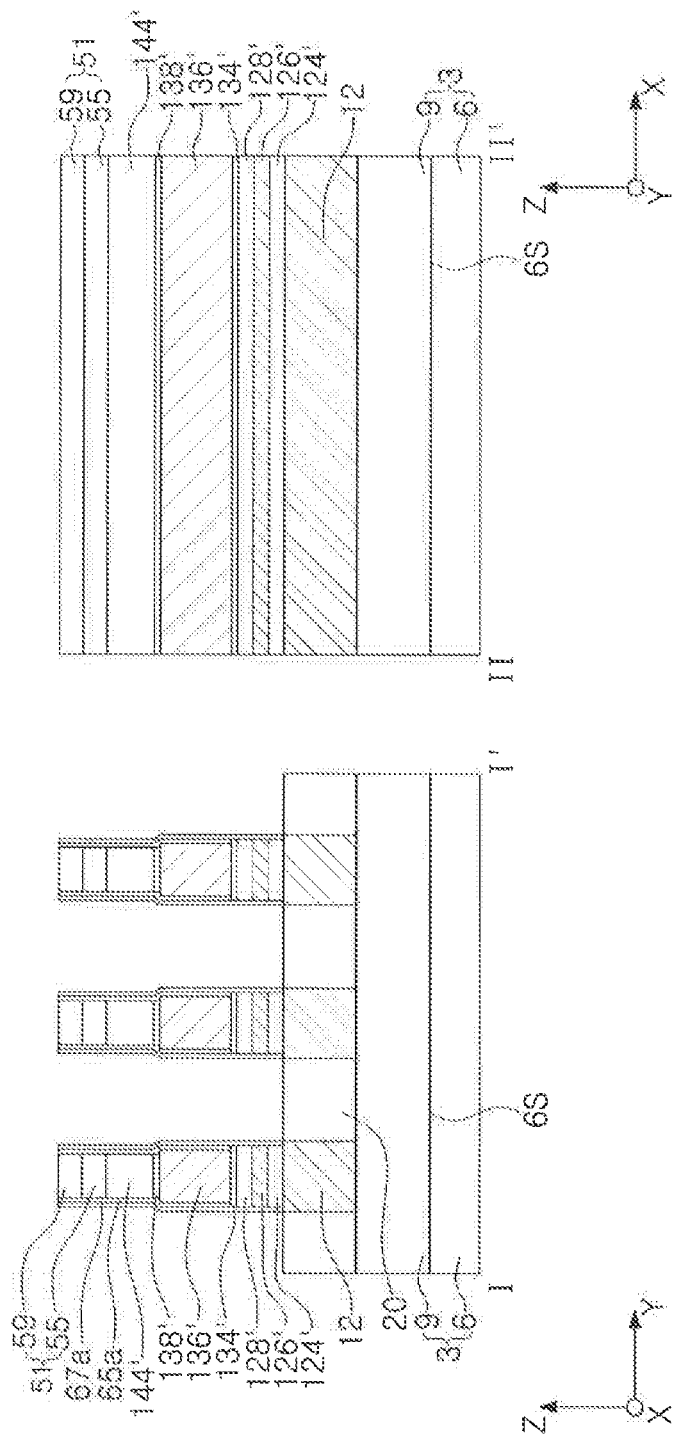

Referring to FIGS. 11 and 12, a partial region of the data storage material layer 136 may be removed using an etching process. A region which is not removed by the etching process may remain as a data storage material line 136'. The data storage material line 136' may have a linear shape extending in the first direction X. As a partial region of the data storage material layer 136 is removed, a portion of an upper surface of the lower electrode layer 134 may be exposed.

As the etching process is performed in the step in which a lateral surface of the upper conductive line 144' is covered by the first protective spacer 161a, the data storage material line 136' disposed in a lower portion of the upper conductive line 144' may have a width greater than a width of the upper conductive line 144'. For example, a width of the data storage material line 136' may be greater than a width of the upper conductive line 144' by a width WP1 of the first protective spacer.

In the process of removing the data storage material layer 136 by the etching process, a residue of the data storage material may be deposited on an external lateral surface of the first protective spacer 161a. In the subsequent cleaning process, as the first protective spacer 161a is removed, the residue of the data storage material may also be removed. Accordingly, the residue of the data storage material may remain on the lower electrode layer 134, the data storage material line 136', and the upper conductive line 144' such that damage to the pattern caused during the cleaning process may be prevented. The cleaning process may be performed under a condition of acid of pH0 to pH4 or alkali of pH6 to pH11. In an exemplary embodiment of the present inventive concept, the first protective spacer 161a may not be removed. Accordingly, the first protective spacer 161a may remain on a lateral surface of the upper conductive line 144' and a lateral surface of the upper electrode line 138' while the residue of the data storage material is deposited on the external lateral surface. However, an exemplary embodiment of the present inventive concept is not limited thereto. The residue of the data storage material deposited on the external surface of the first protective spacer 161a may be removed through the cleaning process.

Referring to FIGS. 1 to 13, a first spacer 65a extending from the lower electrode layer 134 in the third direction Z and the first direction X may be formed. The first spacer 65a may be disposed on a lateral surface of the data storage material line 136', a lateral surface of the upper electrode line 138', and a lateral surface of the upper conductive line 144'.

The first spacer 65a may cover an edge of an upper surface of the data storage material line 136'. The first spacer 65a may have a curved shape to surround an end of an upper surface of the data storage material line 136'.

The first spacer 65a may have a substantially uniform thickness. For example, the first spacer 65a may be formed through atomic layer deposition (ALD). The first spacer 65a may be formed of an insulating material such as silicon oxide, silicon nitride, or the like.

Referring to FIGS. 1 to 14, partial regions of the lower electrode layer 134, the intermediate conductive layer 128, the switching material layer 126, and the lower conductive layer 124 may be removed using an etching process. Regions which are not removed by the etching process may remain as a lower electrode line 134', an intermediate conductive line 128', a switching material line 126', and a lower conductive line 124'.

Each of the lower electrode line 134', the intermediate conductive line 128', the switching material line 126', and the lower conductive line 124' may have a linear shape extending in the first direction X. As the partial regions of the lower electrode layer 134, the intermediate conductive layer 128, the switching material layer 126, and the lower conductive layer 124 are removed, an edge of an upper surface of the first conductive structure 12 and an upper surface of the gap-fill insulating pattern 20 may be exposed.

Referring to FIGS. 1 to 15, a second spacer 67a extending from an edge of an upper surface of the first conductive structure 12 in the third direction Z may be formed. The second spacer 67a may be disposed on a lateral surface of the lower conductive line 124', a lateral surface, of the switching material line 126', a lateral surface of the intermediate conductive line 128', and a lateral surface of the lower electrode line 134'. The second spacer 67a may be disposed on an external lateral surface of the first spacer 65a.

The second spacer 67a may have a curved shape to surround an end of an upper portion of the data storage material line 136'.

The second spacer 67a may have a substantially uniform thickness. For example, the second spacer 67a may be formed through atomic layer deposition (ALD). The second spacer 67a may be formed of an insulating material such as silicon oxide, silicon nitride, or the like.

Figure 16:
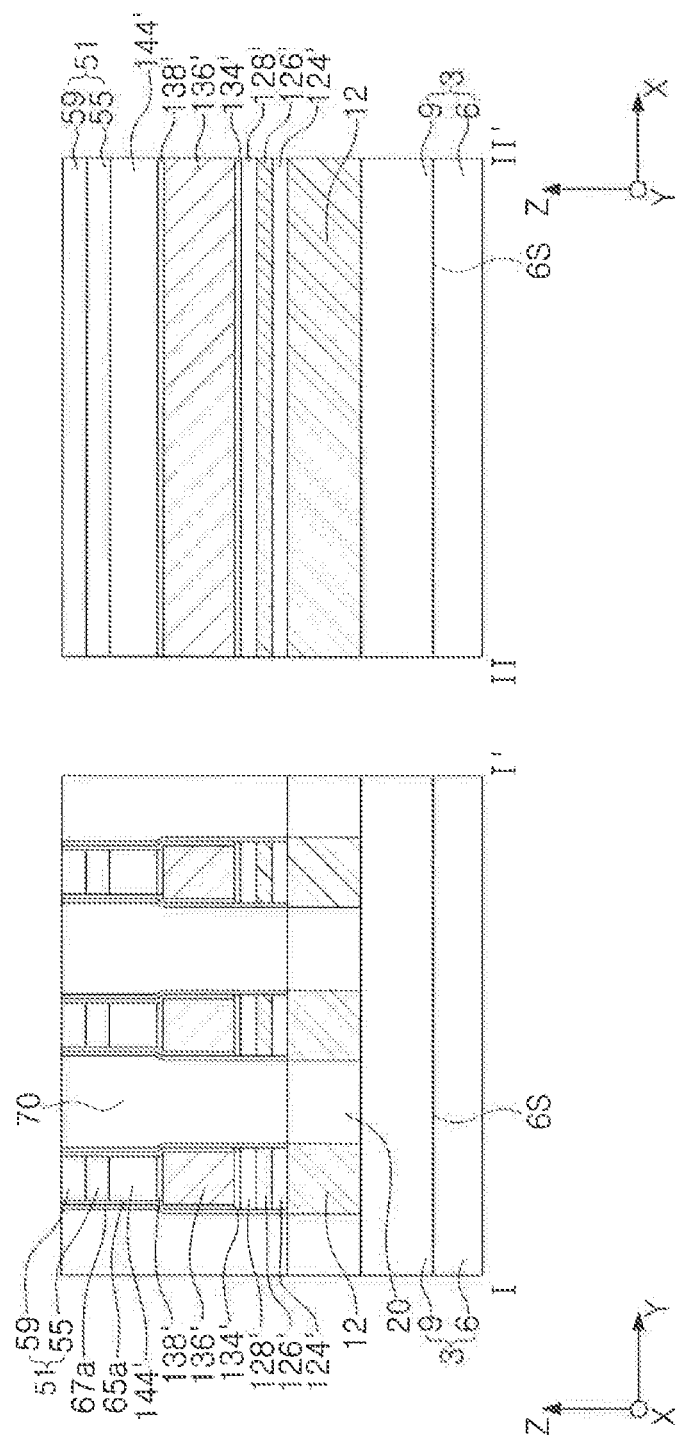

Referring to FIG. 16, a first insulating pattern 70 extending from the gap-fill insulating pattern 20 in the third direction Z may be formed. The first insulating pattern 70 may be in contact with an external lateral surface of the second spacer 67a. The first insulating pattern 70 may be formed of an insulating material such as silicon oxide, silicon nitride, or the like.

Figure 17:
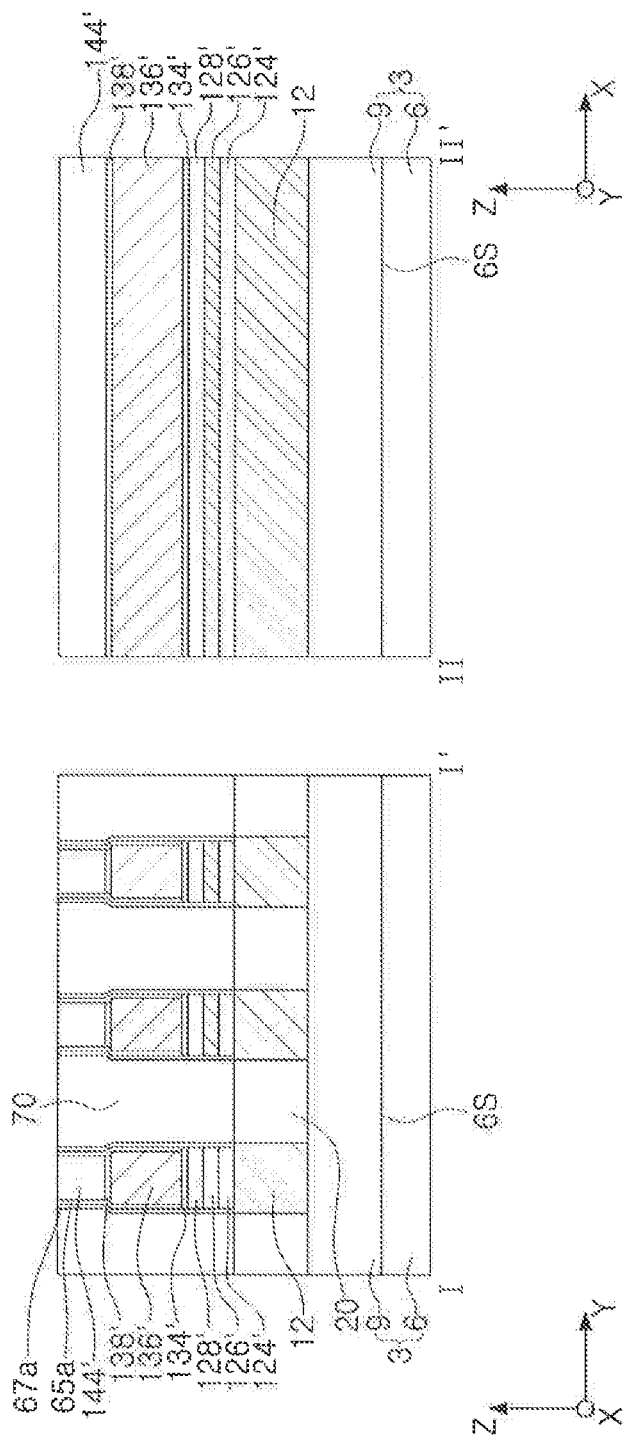

Referring to FIG. 17, the first mask patterns 51, an upper portion of the first spacer 65a, an upper portion of the second spacer 67a, and an upper portion of the first insulating pattern 70 may be removed. An upper surface of the upper conductive line 144' may be exposed.

Figure 18:
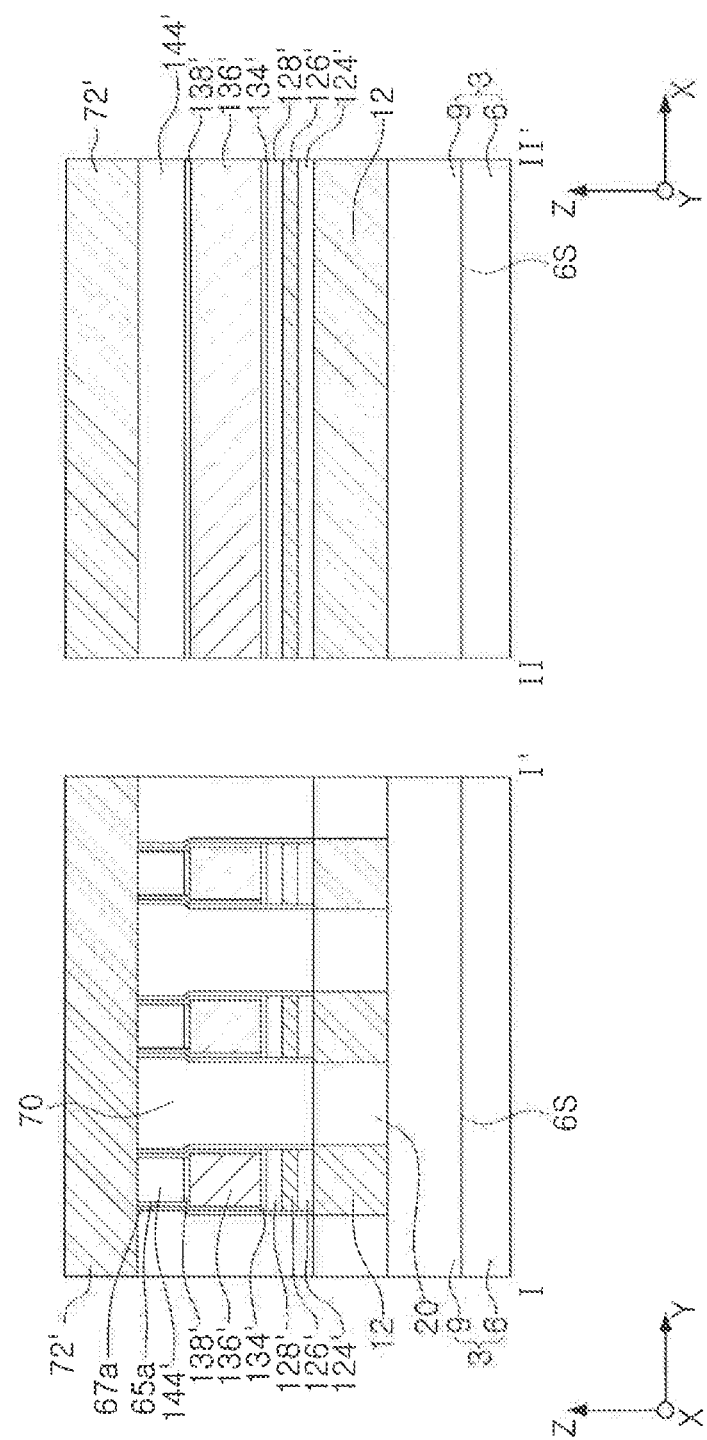

Referring to FIG. 18, a second preliminary conductive layer 72' covering the exposed upper surface of the upper conductive line 144' and an upper surface of the first insulating pattern 70 may be formed. The second preliminary conductive layer 72' may be in parallel to the upper surface 6s of the semiconductor substrate 6 and may extend in the first and second directions X and Y.

Referring to FIGS. 8 to 18, a structure of a semiconductor device according to an exemplary embodiment of the present inventive concept may be manufactured by changing an etching process and a process of forming a spacer.

In the present embodiment, a partial region of the upper conductive layer 144 may be removed using an etching process, and a protective spacer may be formed.

In the present embodiment, after removing the partial region of the upper conductive layer 144 using the etching process, the protective spacer may be formed. The protective spacer may be formed through a cleaning process, a partial region of an upper electrode layer 138 may be removed, and another protective spacer may be formed.

In the description below, a process of etching a cell stack in the second direction Y will be described.

Figure 19:
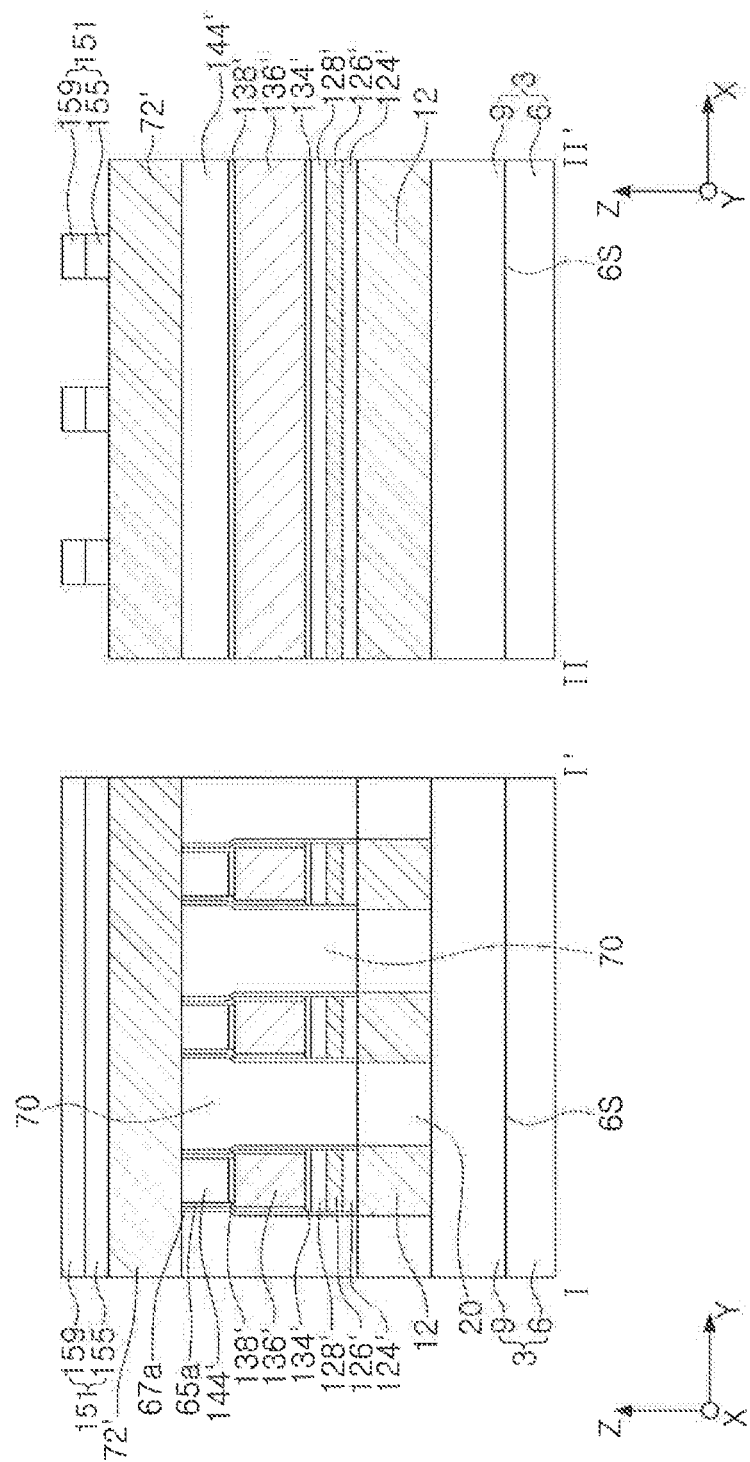

Referring to FIGS. 1 and 19, second mask patterns 151 each having a linear shape extending in the second direction Y may be formed on an upper surface of a second preliminary conductive layer 72'. The second mask patterns 151 may include a poly silicon layer 155 and a silicon oxide layer 159 stacked in that order.

Figure 20:
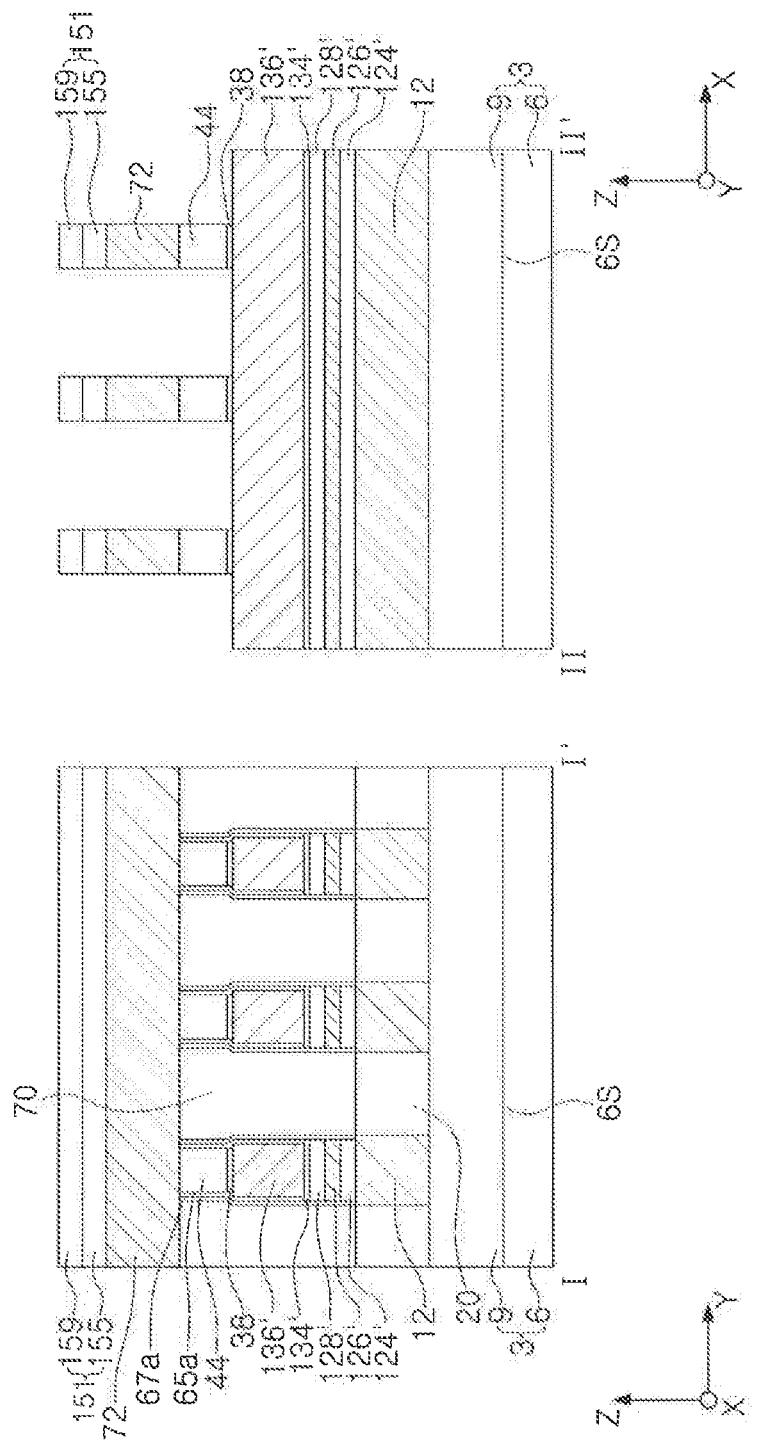

Referring to FIGS. 1 and 20, partial regions of the second preliminary conductive layer 72', the upper conductive line 144', and the upper electrode line 138' may be removed. Accordingly, a second conductive structure 72, an upper conductive pattern 44, and an upper electrode pattern 38 may be formed. A portion of an upper surface of the data storage material line 136' may be exposed through the etching process.

Figure 21:
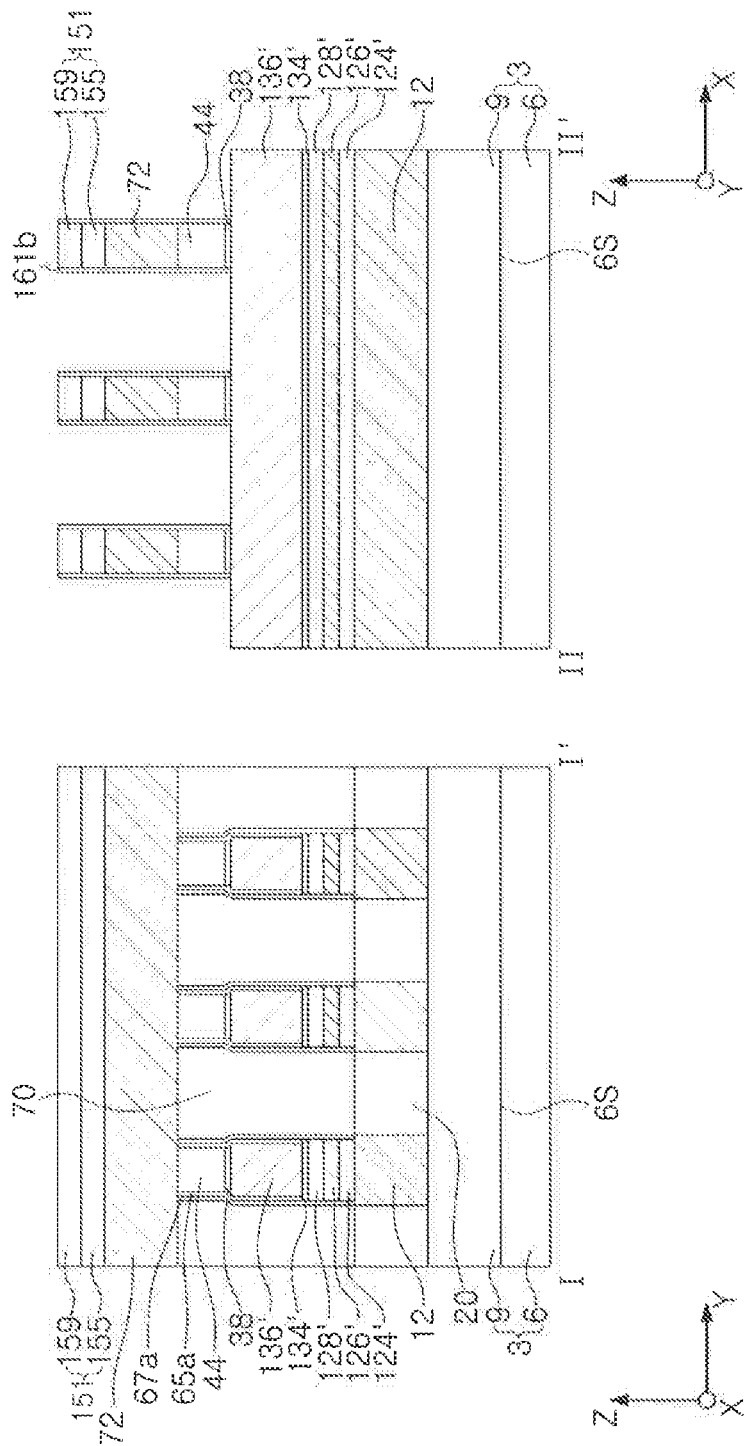

Referring to FIG. 21, a second protective spacer 161b covering a lateral surface of the upper conductive pattern 44, a lateral surface of the upper electrode pattern 38, and a lateral surface of the second mask patterns 151 may be formed. The second protective spacer 161b may extend from a portion of an upper surface of the data storage material line 136' in the third direction Z. The second protective spacer 161b may be formed of an insulating material such as silicon oxide, silicon nitride, or the like.

For example, the second protective spacer 161b may be formed through atomic layer deposition. The second protective spacer 161b may be formed using an atomic layer deposition method at a temperature of about 0° C. or higher and 250° C. or lower approximately. A width of the second protective spacer 161b may be vary in an exemplary embodiment of the present inventive concept.

Before the second protective spacer 161b is formed, an acid-based cleaning process or an alkali-based cleaning process may be performed.

Figure 22:
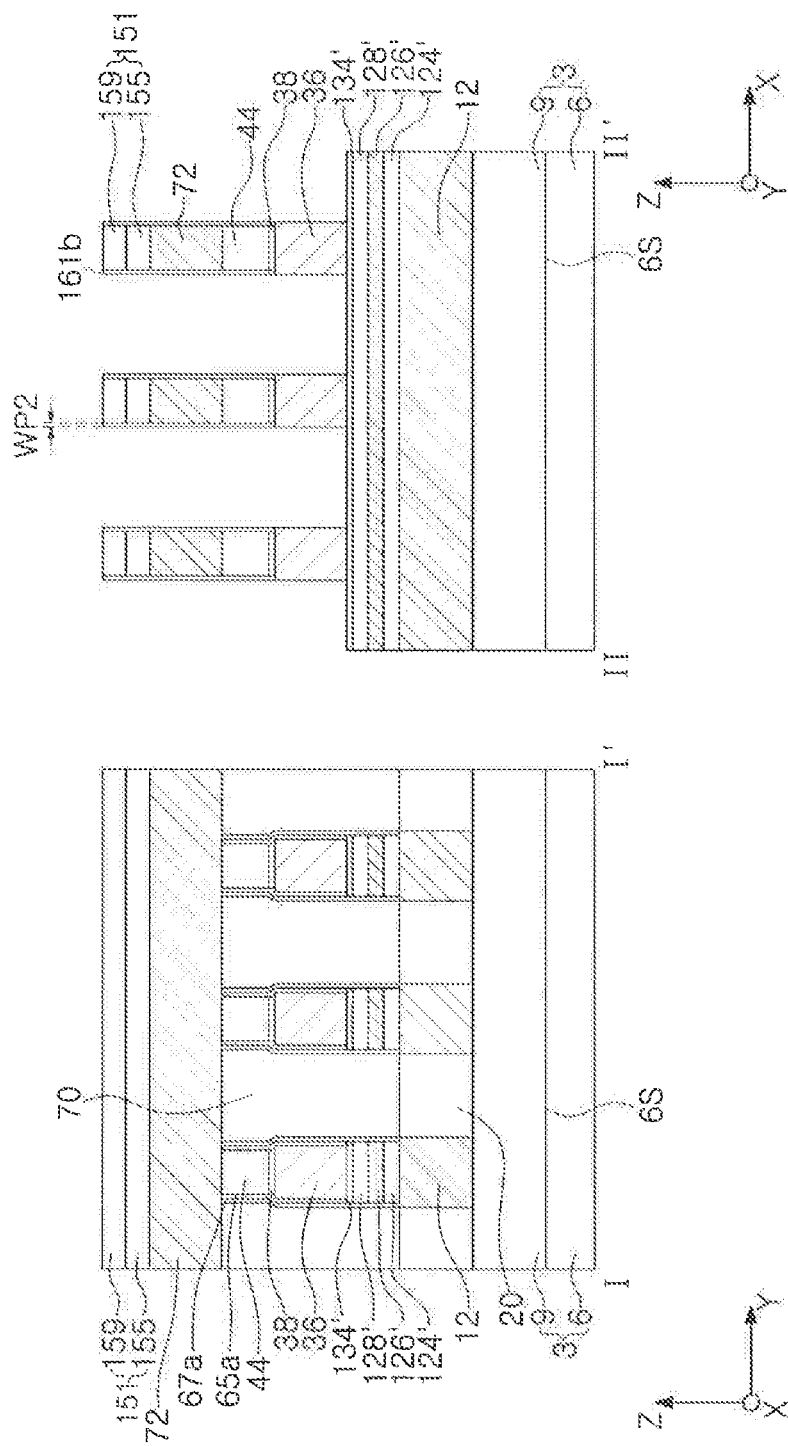
Figure 23:
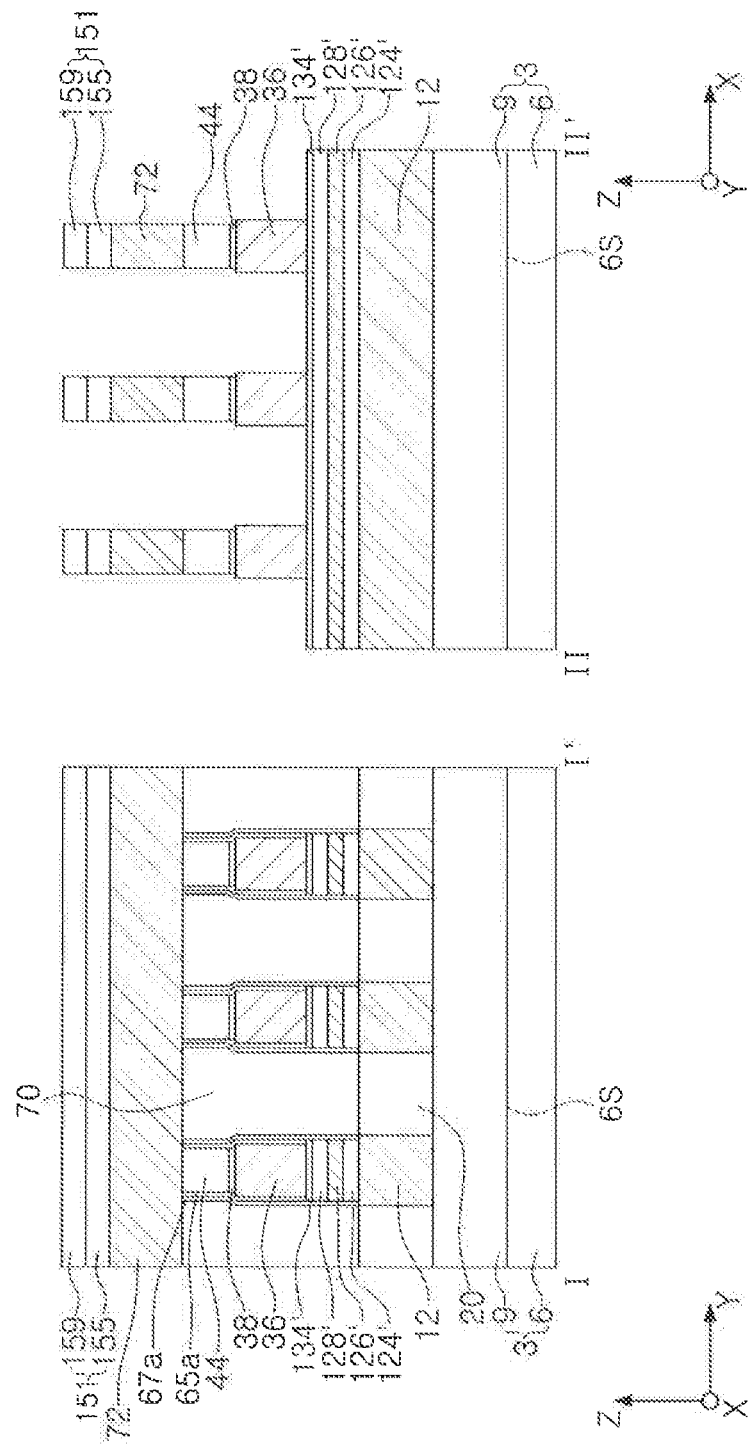

Referring to FIGS. 22 and 23, a partial region of the data storage material line 136' may be removed using an etching process. As the partial region of the data storage material line 136' having a linear shape is removed, a data storage material pattern 36 may be formed. A portion of an upper surface of the lower electrode line 134' may be exposed through the etching process.

As the etching process is performed in a step in which a lateral surface of the upper conductive pattern 44 is covered by the second protective spacer 161b, the data storage material pattern 36 disposed on a lower portion of the upper conductive pattern 44 may have a width greater than a width of the upper conductive pattern 44. For example, a width of the data storage material pattern 36 may be greater than a width of the upper conductive pattern 44 by a width WP2 of the second protective spacer.

In the process of removing the data storage material line 136' through the etching process, a residue of a data storage material may be deposited on an external lateral surface of the second protective spacer 161b. In a subsequent cleaning process, the residue of the data storage material may be effectively removed as the second protective spacer 161b is removed. Accordingly, the residue of the data storage material may remain on the lower electrode line 134', the data storage material pattern 36, and the upper conductive pattern 44 such that damage to the pattern, which may occur in the cleaning process, may be prevented.

In an exemplary embodiment of the present inventive concept, the second protective spacer 161b may not be removed. Accordingly, the second protective spacer 161b may remain on a lateral surface of the upper conductive pattern 44 and a lateral surface of the upper electrode pattern 38 while the residue of the data storage material is deposited on an external lateral surface of the second protective spacer 161b. However, the present inventive concept is not limited thereto. The residue of the data storage material deposited on the external lateral surface of the second protective spacer 161b may be removed through a cleaning process.

Figure 24:
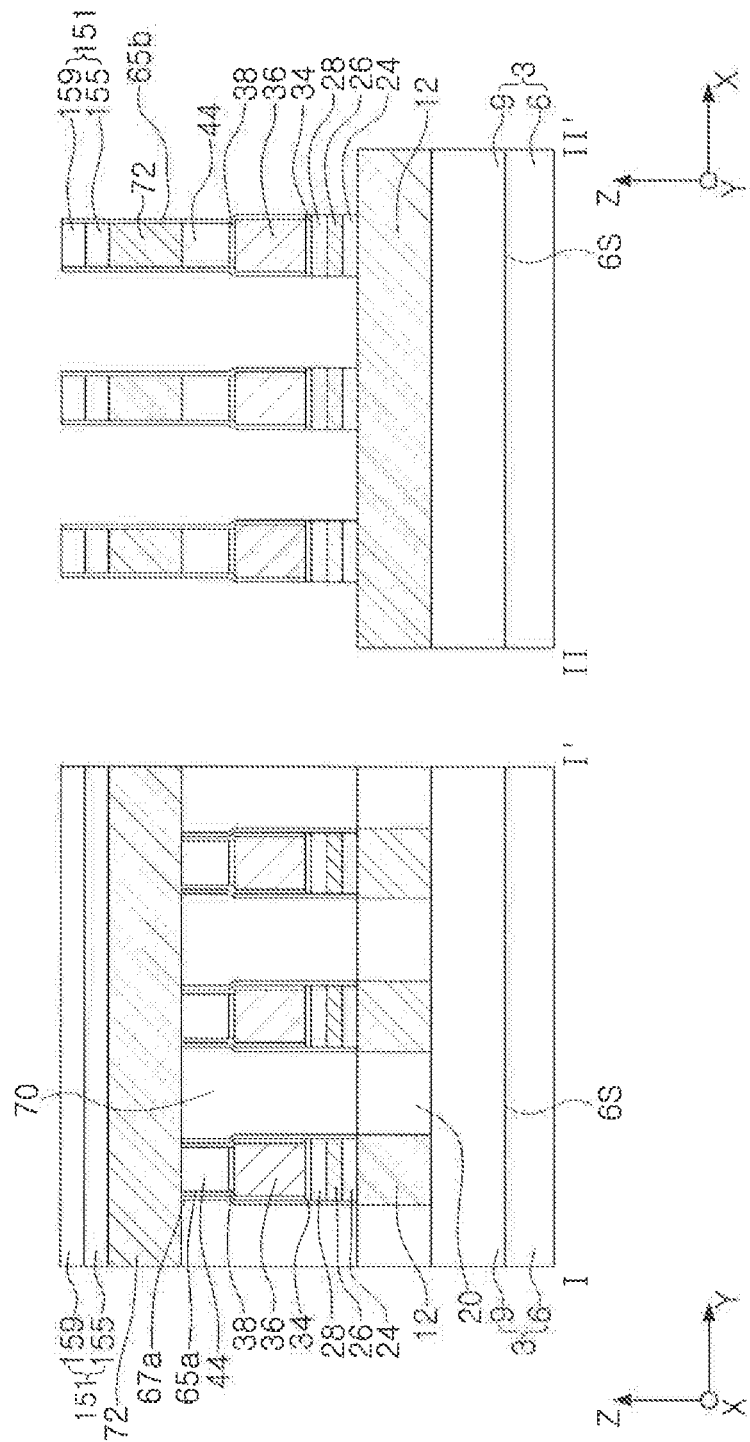

Referring to FIG. 24, a third spacer 65b extending from the intermediate conductive line 134' in the third direction Z and the first direction X may be formed. The third spacer 65b may be disposed on a lateral surface of the data storage material pattern 36, a lateral surface of the upper electrode pattern 38, and a lateral surface of the upper conductive pattern 44. The third spacer 65b may include a portion extending further than the first spacer 65a in the third direction Z and may be disposed on a lateral surface of the second conductive structure 72.

The third spacer 65b may cover an edge of an upper surface of the data storage material pattern 36. The third spacer 65b may have a curved shape to surround an end of an upper surface of the data storage material pattern 36.

The third spacer 65b may have a substantially uniform thickness and may have a first spacer width WS1. For example, the third spacer 65b may be formed through atomic layer deposition. The third spacer 65b may be formed of an insulating material such as silicon oxide, silicon nitride, or the like.

Partial regions of the lower electrode line 134', the intermediate conductive line 128', the switching material line 126', and the lower conductive line 124' may be removed. Accordingly, the lower electrode pattern 34, the intermediate conductive pattern 28, the switching material pattern 26, and the lower conductive pattern 24 may be formed.

An upper surface of the first conductive structure 12 and an upper surface of the gap-fill insulating pattern 20 may be exposed through the etching process.

Figure 25:
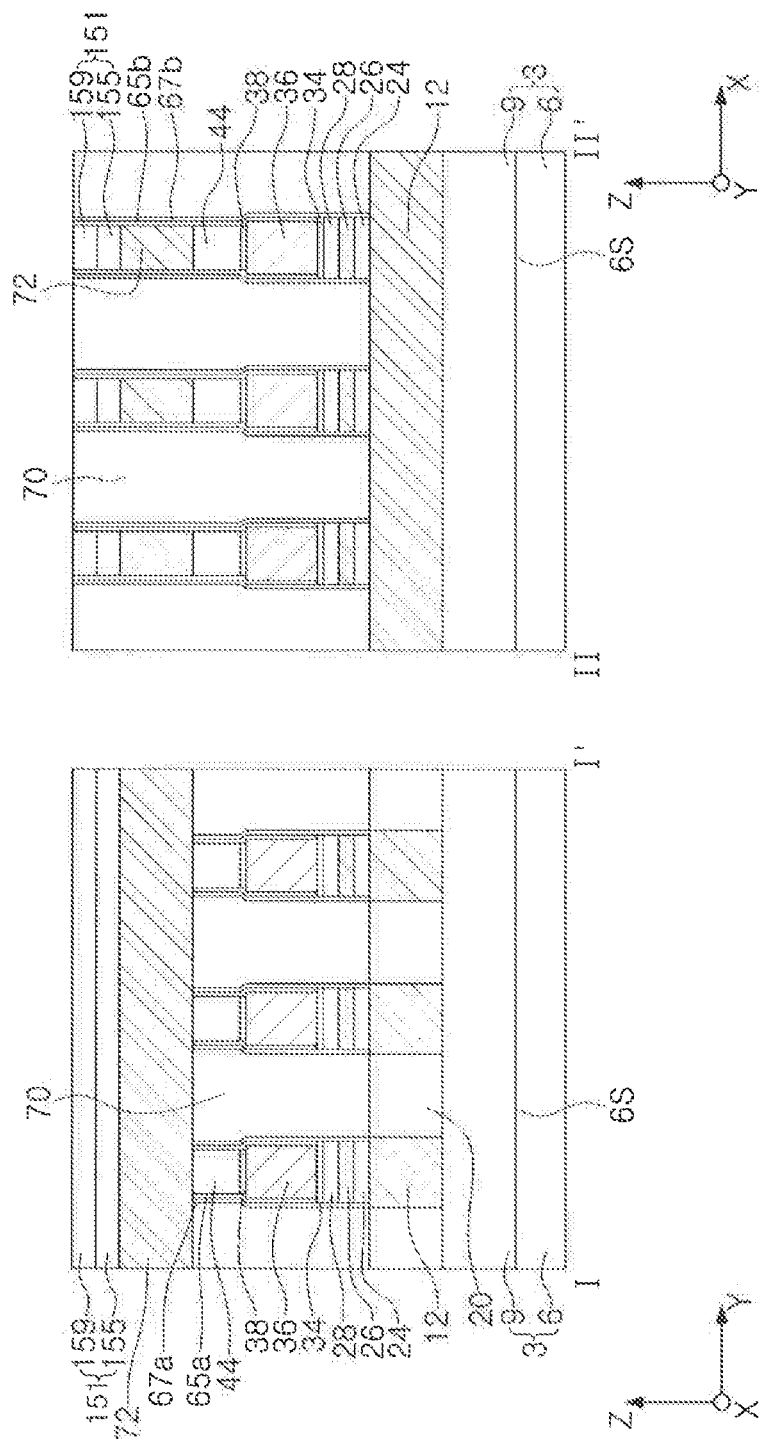

Referring to FIG. 25, a fourth spacer 67b extending from an upper surface of the first conductive structure 12 in the third direction Z may be formed. The fourth spacer 67b may be disposed on a lateral surface of the lower conductive pattern 24, a lateral surface of the switching material pattern 26, a lateral surface of the intermediate conductive pattern 28, and a lateral surface of the lower electrode pattern 34. The fourth spacer 67b may be disposed on an external lateral surface of the third spacer 65b. The fourth spacer 67b may include a portion extending further than the second spacer 67a in the third direction Z and may be disposed on a lateral surface of the second conductive structure 72.

The fourth spacer 67b may have a curved shape to surround an end of an upper portion of the data storage material pattern 36.

The fourth spacer 67b may have a substantially uniform thickness. For example, fourth spacer 67b may be formed through atomic layer deposition. The fourth spacer 67b may be formed of an insulating material such as silicon oxide, silicon nitride, or the like.

A first insulating pattern 70 extending from the first conductive structure 12 in the third direction Z may be formed. The first insulating pattern 70 may be in contact with an external lateral surface of the fourth spacer 67b. The first insulating pattern 70 may be formed of an insulating material such as silicon oxide, silicon nitride, or the like.

Figure 26:
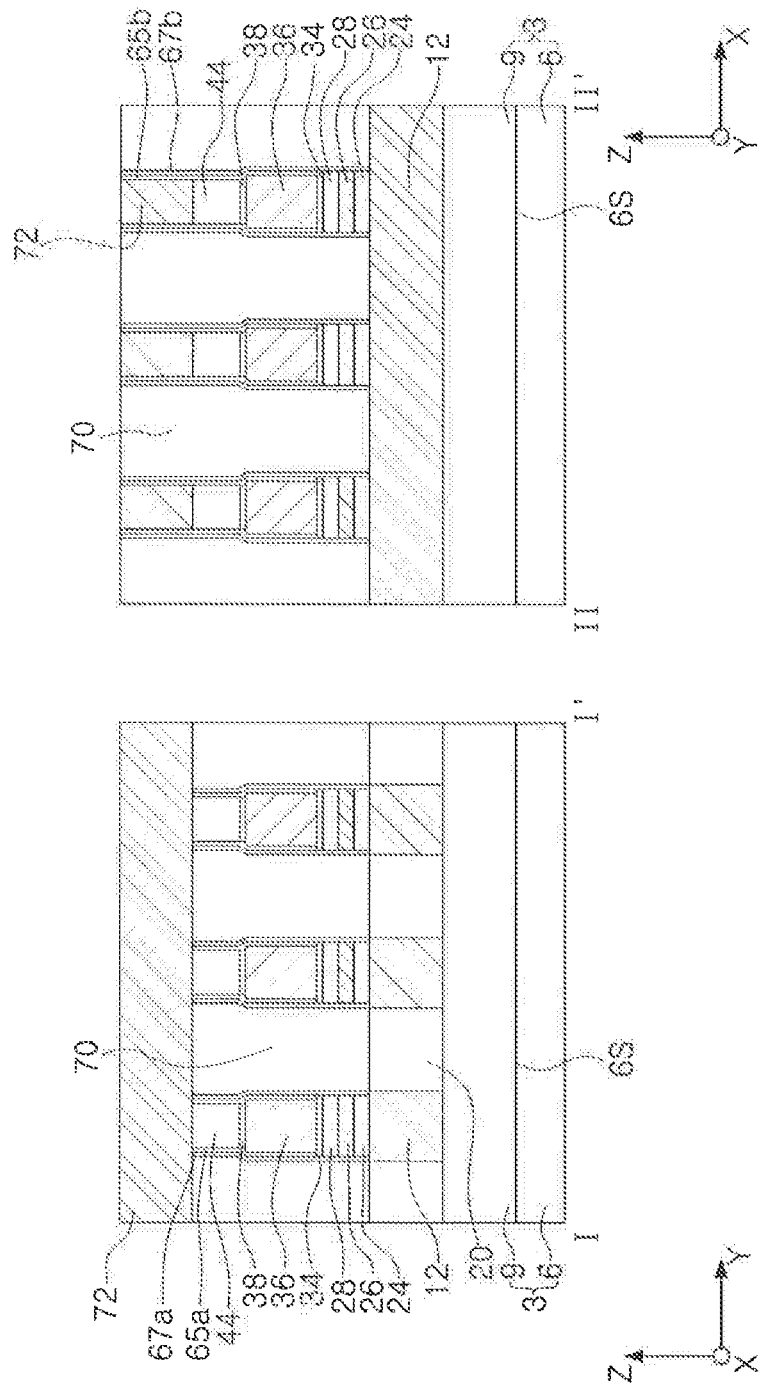

Referring to FIG. 26, the second mask patterns 151, an upper portion of the third spacer 65b, an upper portion of the fourth spacer 67b, and an upper portion of the first insulating pattern 70 may be removed. An upper surface of the first insulating pattern 70 may be exposed.

Referring to FIGS. 19 and 26, a structure of a semiconductor device according to a modified exemplary embodiment of the present inventive concept may be manufactured by changing an etching process and a process of forming a spacer.

In the present embodiment, partial regions of the second preliminary conductive layer 72' and the upper conductive line 144' may be removed using an etching process. In addition, a protective spacer may be formed, and partial regions of the upper electrode line 138' and the data storage material line 136 may be removed using an etching process. Accordingly, a modified exemplary embodiment of the exemplary embodiment illustrated in FIGS. 3A and 3B may be provided.

In the modified exemplary embodiment, partial regions of the second preliminary conductive layer 72' and the upper conductive line 144' may be removed using an etching process. In addition, a protective spacer may be formed, and the protective spacer may be removed through a cleaning process. Further, a partial region of the upper electrode line 138' may be removed, and another protective spacer may be formed. Accordingly, a modified exemplary embodiment of the exemplary embodiment illustrated FIGS. 4A and 4B may be provided.

According to an exemplary embodiment of the present inventive concept, by including at least a single process of forming a spacer on an upper portion of the data storage material pattern after the etching process, a leaning defect of the semiconductor device pattern may be prevented.

In addition, as the spacers, which may remove residual metals remaining in the etching process, may be formed, damage to the semiconductor device caused by the residual metals may be prevented.

While the present inventive concept has been particularly shown and described with reference to exemplary embodiments thereof, it will be apparent to those of ordinary skill in the art that various changes in form and detail may be made thereto without departing from the spirit and scope of the present inventive concept as defined by the following claims.

What is claimed is:

1. A semiconductor device, comprising:
   a first conductive structure on a substrate;
   a second conductive structure on the first conductive structure; and
   a first memory cell structure between the first conductive structure and the second conductive structure,
   wherein the first memory cell structure includes:
   a switching material pattern on the first conductive structure;
   a data storage material pattern on the switching material pattern;
   an upper conductive pattern on the data storage material pattern;
   a lower conductive pattern between the first conductive structure and the switching material pattern; and
   an intermediate conductive pattern between the switching material pattern and the data storage material pattern,
   wherein lateral surfaces of the lower conductive pattern, the switching material pattern, and the intermediate conductive pattern are substantially coplanar,
   wherein a maximum width of a lower region of the data storage material pattern is less than a minimum width of the switching material pattern, and
   wherein a maximum width of the upper conductive pattern is less than a width of an upper region of the data storage material pattern.

2. The semiconductor device of claim 1, further comprising:
   a lower electrode pattern between the intermediate conductive pattern and the data storage material pattern; and
   an upper electrode pattern between the data storage material pattern and the upper conductive pattern,
   wherein a maximum width of the upper electrode pattern is less than the width of the upper region of the data storage material pattern.

3. The semiconductor device of claim 2, wherein a lateral surface of the lower electrode pattern and the lateral surface of the switching material pattern are substantially coplanar.

4. The semiconductor device of claim 2, wherein a minimum width of the upper electrode pattern is substantially the same as the maximum width of the upper conductive pattern.

5. The semiconductor device of claim 2, wherein the maximum width of the upper electrode pattern is greater than the maximum width of the upper conductive pattern, and the maximum width of the upper electrode pattern is substantially the same as a width of an upper surface of the data storage material pattern.

6. The semiconductor device of claim 2, wherein the maximum width of the upper conductive pattern is less than the maximum width of the upper electrode pattern.

7. The semiconductor device of claim 1, further comprising:
   a first spacer disposed on a lateral surface of the upper conductive pattern and a lateral surface of the data storage material pattern, and covering an edge of an upper surface of the data storage material pattern; and
   a second spacer on an external lateral surface of the first spacer and on a lateral surface of the switching material pattern.

8. The semiconductor device of claim 7, further comprising:
   a protective spacer disposed between the first spacer and the upper conductive pattern,
   wherein the lateral surface of the data storage material pattern directly contacts the first spacer.

9. The semiconductor device of claim 1, further comprising:
   a third conductive structure on the second conductive structure; and
   a second memory cell structure between the second conductive structure and the third conductive structure.

10. A semiconductor device, comprising:
  first conductive lines extending in a first direction on a substrate;
  second conductive lines extending on the first conductive lines in a second direction substantially perpendicular to the first direction;
  memory cell regions between the first conductive lines and the second conductive lines,
  wherein the memory cell regions include a first memory cell region, and a second memory cell region adjacent to the first memory cell region;
  an insulating pattern on a lateral surface of each of the memory cell regions; and
  first spacer structures disposed between the first memory cell region and the insulating pattern in the second direction, and between the second memory cell region and the insulating pattern in the second direction,
  wherein the first memory cell region includes:
    a first data storage material pattern;
    a first upper electrode pattern on the first data storage material pattern; and
    a first upper conductive pattern on the first upper electrode pattern,
  wherein the second memory cell region includes:
    a second data storage material pattern;
    a second upper electrode pattern on the second data storage material pattern; and
    a second upper conductive pattern on the second upper electrode pattern, and
  wherein a minimum distance between the first data storage material pattern and the second data storage material pattern is less than a minimum distance between the first upper conductive pattern and the second upper conductive pattern.

11. The semiconductor device of claim 10, wherein a third distance between the first upper electrode pattern and the second upper electrode pattern is substantially the same as the first distance.

12. The semiconductor device of claim 10, wherein a minimum distance between the first upper electrode pattern and the second upper electrode pattern is greater than the first distance, and a maximum distance between the first upper electrode pattern and the second upper electrode pattern is less than the second distance.

13. The semiconductor device of claim 10, wherein a maximum distance between the first upper electrode pattern and the second upper electrode pattern is substantially the same as the second distance.

14. The semiconductor device of claim 10, further comprising:
  second spacer structures disposed between the first memory cell region and the insulating pattern, and between the second memory cell region and the insulating pattern.

15. The semiconductor device of claim 14, wherein a height of each of the second spacer structures is higher than a height of each of the first spacer structures in a third direction substantially perpendicular to an upper surface of the substrate.

16. The semiconductor device of claim 14, wherein the first spacer structure includes a first region on a first lateral surface of the first data storage material pattern and a second region on an external lateral surface of the first region, and the second spacer structure includes a third region on a second lateral surface of the first data storage material pattern and a fourth region on an external lateral surface of the third region.

17. The semiconductor device of claim 16, wherein the first region and the third region cover an edge of an upper surface of the first data storage material pattern.

18. A semiconductor device, comprising:
  a first conductive structure on a substrate;
  a second conductive structure on the first conductive structure;
  a first memory cell structure between the first conductive structure and the second conductive structure;
  a third conductive structure on the second conductive structure; and
  a second memory cell structure between the second conductive structure and the third conductive structure,
  wherein each of the first and second memory cell structures includes:
    a switching structure;
    a data storage structure on the switching structure; and
    an upper conductive pattern on the data storage structure,
  wherein the switching structure includes:
    a lower conductive pattern on the substrate;
    a switching material pattern on the lower conductive pattern; and
    an intermediate conductive pattern on the switching material pattern,
  wherein the data storage structure includes:
    a lower electrode pattern on the intermediate conductive pattern;
    a data storage material pattern on the lower electrode pattern; and
    an upper electrode pattern on the data storage material pattern,
  wherein a largest width of a lower region of the data storage material pattern is less than a smallest width of the switching material pattern, and
  wherein a largest width of the upper electrode pattern and a largest width of the upper conductive pattern are less than a target width of the data storage material pattern.

19. The semiconductor device of claim 18, further comprising:
  a first spacer covering a lateral surface and an edge of an upper surface of the data storage material pattern and a lateral surface of the upper conductive pattern; and
  a second spacer covering an external lateral surface of the first spacer and a lateral surface of the switching structure.

* * * * *